United States Patent [19]

Ando et al.

[11] Patent Number: 5,373,168
[45] Date of Patent: Dec. 13, 1994

[54] TWO-DIMENSIONAL ELECTRON GAS FIELD EFFECT TRANSISTOR INCLUDING AN IMPROVED INGAAS CHANNEL LAYER

[75] Inventors: Yuji Ando; Kazuhiko Onda; Masaaki Kuzuhara, all of Tokyo, Japan

[73] Assignee: NEC Corporation, Tokyo, Japan

[21] Appl. No.: 988,407

[22] Filed: Dec. 7, 1992

[30] Foreign Application Priority Data

Dec. 5, 1991 [JP] Japan .................. 3-320828

[51] Int. Cl.$^5$ .................. H01L 29/80; H01L 29/161; H01L 29/205; H01L 29/227
[52] U.S. Cl. .................. 257/24; 257/192; 257/194; 257/20; 257/191
[58] Field of Search .................. 257/24, 190, 194, 20, 257/191, 192, 26; 372/44, 45, 50

[56] References Cited

U.S. PATENT DOCUMENTS 4,833,508  5/1989  Ishikawa et al. .................. 257/194
5,091,759  2/1992  Shih et al. .................. 257/194

FOREIGN PATENT DOCUMENTS 60-144979  7/1985  Japan .
63-161678  7/1988  Japan .

OTHER PUBLICATIONS

IEEE Electron Device Letters, vol. EDL-7, No. 12, pp. 444–446, Dec. 1986.
Physical Review B vol. 30, No. 2, pp. 840–847, Jul. 15, 1984.

Primary Examiner—William D. Larkins
Assistant Examiner—Nathan K. Kelley
Attorney, Agent, or Firm—Sughrue, Mion, Zinn, Macpeak & Seas

[57] ABSTRACT

The invention provides a compound semiconductor multilayer structure having a two-dimensional electron gas, which is applicable to field effect transistors. A ternary compound InGaAs planar channel layer serving as a quantum well has a variation of an In (indium) fraction in a perpendicular direction to a heterojunction interface. The variation has a step-graded profile with taking a maximum value at or in the vicinity of a portion where the two-dimensional electron gas takes a maximum density. Such quantum well has most large depth at a portion except for adjacent portions to the heterojunction interfaces. Such multilayer structure provides a great electron mobility and a strong electron confinement to major electrons at a high electron density portion. Such multilayer structure provides the large effective electron mobility and the large sheet electron density to the two-dimensional electron gas without a gain of the average of the In (indium) fractions, thereby suppressing the enlargement of the lattice mismatch which causes misfit dislocations in crystals.

20 Claims, 11 Drawing Sheets

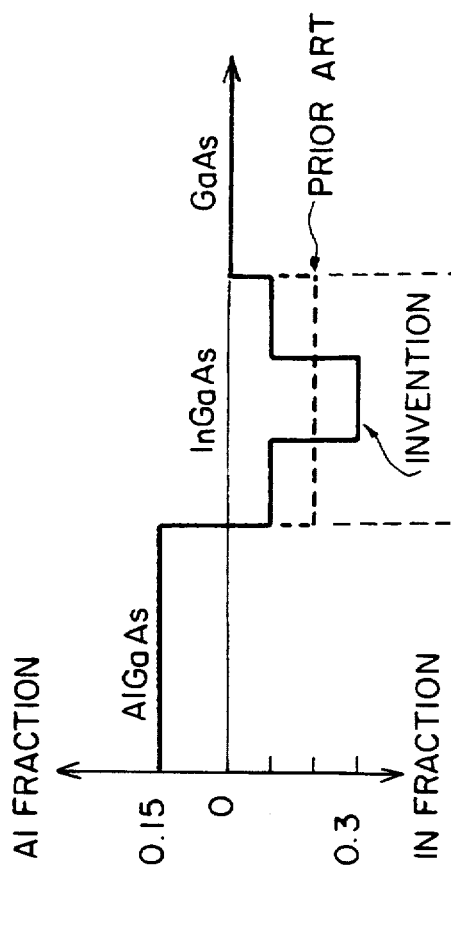
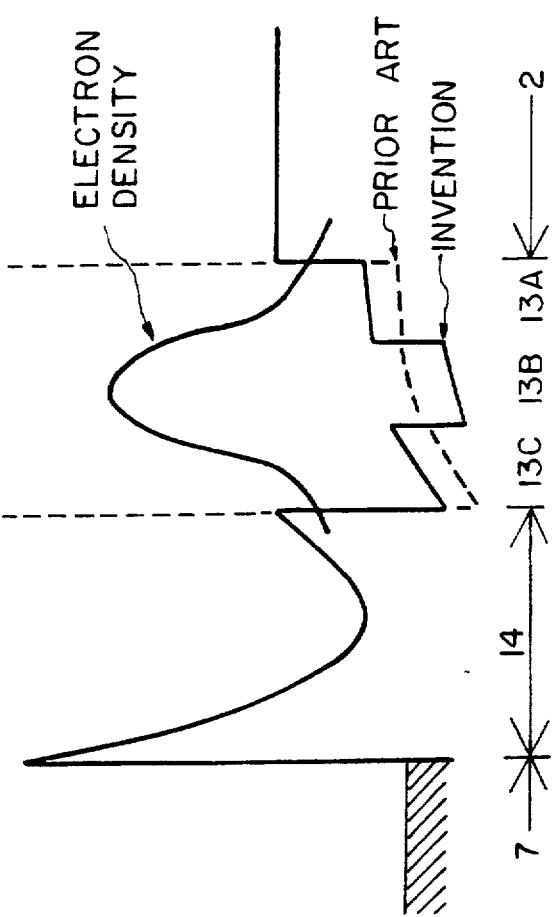
FIG. 2B
FIG. 2C

TWO-DIMENSIONAL ELECTRON GAS FIELD EFFECT TRANSISTOR INCLUDING AN IMPROVED INGAAS CHANNEL LAYER

BACKGROUND OF THE INVENTION

The invention relates to a quantum well device, and more particularly to a two-dimensional electron gas field effect transistor (2DEGFET) including an improved InGaAs channel layer parallel to an interface of heterojunction.

A high speed performance is most important to semiconductor devices, because semiconductor devices possessing higher speed performances are permissive of realizing more excellent computers and various high quality micro electronics devices. The realization of the enlargement of the speed of the device performance is mainly provided by following two ways. One is the minimization of the device size, especially the channel length in the field effect transistors. Another is the enlargement of tile electron drift speed moving in a semiconductor material. The improvements in the semiconductor fabrication process techniques makes the gate length short, thereby providing a high speed performance to the transistor. However, the possible increase of the transistor performance speed up to a maximum requires not only the minimization of the device size but the enlargement of the electron drift speed.

The electron drift speed is associated with the mobility of electrons serving as carriers in a semiconductor material. The mobility of the electrons serving as carriers depends upon the effective mass of electrons and the scattering probability. The scattering probability of electrons serving as carriers also depends upon the mean free path defined by the average distance traveled between successive collisions. The effective mass of electrons and the scattering probability and thus the mean free path are determined by the crystal structure possessed by a crystal medium in a semiconductor material. Thus, the electron mobility is determined by the crystal structure possessed by a crystal medium in a semiconductor material. The enlargement of the electron mobility provides high speed performances for semiconductor devices such as field effect transistors.

Generally, the gallium arsenide (GaAs) based crystal medium is likely to possess more excellent electron transport properties as compared to the silicon (Si) based crystal medium, because the electron effective mass in the gallium arsenide (GaAs) based crystal medium is smaller than that in the silicon (Si) based crystal medium. The small electron effective mass allows electrons to be subjected to a large acceleration by an electric field during the travel between the collusions.

Further, electrons in a semiconductor are subjected to scattering by not only lattice oscillations of crystals caused by a thermal energy but ionized impurities doped into the semiconductors. The gallium arsenide (GaAs) based crystal medium possesses a lower scattering probability of electrons as compared to the silicon (Si) based crystal medium. This also contributes towards the promotion of the enlargement of the electron mobility. Thus, the gallium arsenide (GaAs) based crystal medium possesses a larger mean free path than that of the silicon (Si) based crystal medium. Electrons serving as carriers in the gallium arsenide (GaAs) based crystal medium are accelerated without being subjected to scattering by an electric field but for a longer time between the collisions thereby resulting in high speed electrons.

By the way, in view of the minimization of the device size and the promotion of the performance speed of The device, high quality quantum effect devices utilizing quantum effects are attractive. Some of the quantum effect devices have potential well, or quantum well in which electrons are confined thereby the electrons confined in the quantum well are likely to express various quantum effects, where potential barriers fence the potential wells, or quantum well. The one-dimensional electron confinement in the quantum well, or one-dimensional potential well is permissive to promote the enlargement of the electron mobility. The electrons confined in the quantum well, or the one-dimensional potential well are able to move freely in the other two dimensions thereby forming a two-dimensional electron gas. Such a two-dimensional electron gas forms a planar channel layer.

The modulation-doped field effect transistor (MODFET) is one of such semiconductor devices utilizing the two-dimensional electron gas forming a conduction channel region. The accomplishment of modulation doping is to separate electrons serving as carriers from ionized impurities so that electrons are able to possess a large mobility due to no affection by impurity scattering. The modulation doping is realized in a semiconductor heterostructure in which only part of the semiconductor material having a larger energy band gap is doped with the n-type dopant. The other semiconductor material is undoped or unintentionally doped.

With respect to the energy bad gap, the conduction band edge of the semiconductor having the smaller band gap exists below the conduction band edge of the semiconductor having the larger band gap. Electrons move from the large band gap semiconductor into the small band gap semiconductor but in the vicinity of the interface between the heterojunctions, after which the electrons remain in the small energy band gap semiconductor thereby forming a two-dimensional electron gas. The large energy band gap semiconductor serves as the potential barrier to the electrons. The small energy band gap semiconductor serves as the potential well. The electrons are, therefore, confined in the one-dimensional potential well of the small energy band gap planar semiconductor by the fence of the potential barrier provided by the large energy band gap semiconductor.

The property of the two-dimensional electron gas is important to devices such as the modulation-doped field effect transistors (MODFETs) or the high electron mobility transistors (HEMT). One of the most important properties of the two-dimensional electron gas field effect transistors is the electron mobility, especially the mobility of electrons existing in the two-dimensional potential well, or the quantum well serving as the planar channel layer. The mobility of electrons in the two-dimensional potential well is associated with the heterostructure interface between the compound semiconductors forming the potential well and the potential barrier respectively. Other of the most important properties of the two-dimensional electron gas field effect transistors is the sheet electron density in the one-dimensional potential well, or the quantum well serving as the planner channel layer. The sheet electron density in the one-dimensional potential well, or the quantum well serving as the planar channel layer also depends upon the heterostructure interface between the compound semiconductors forming the potential well and the potential barrier respectively. Thus, the property of the one-dimensional electron confinement and the characteristic of the electron transport in other two directions depend upon the semiconductor heterostructures, or the compound semiconductors.

The gallium arsenide / aluminium gallium arsenide (GaAs/AlGaAs) heterostructure is applicable to the heterostructure device such as the modulation-doped field effect transistor, which has been studied previously to other heterostructures. The indium gallium arsenide / aluminium gallium arsenide (InGaAs/AlGaAs) heterostructure is also applicable to the heterostructure device such as the modulation-doped field effect transistor. The InGaAs/AlGaAs modulation-doped field effect transistor is more attractive due to the greater ability at the one-dimensional electron confinement and the excellent property of the electron transport in other two directions parallel to the interface of the heterojunctions. One of the InGaAs/AlGaAs modulation-doped field effect transistor is disclosed in IEEE Electron Devise Letters, vol. EDL-7, No. 12, pp. 444–446, December 1986 reported by T. HENDERSON at al.

One of the conventional InGaAs/AlGaAs two-dimensional electron gas field effect transistor will now be described in detail with reference to FIGS. 1A to 1C to understand concretely the device structure and performance.

With reference to FIG. 1A, a semi-insulating substrate 1 is prepared to form multi-epitaxial layers of compound semiconductors by using molecular beam epitaxy (MBE). The semi-insulating substrate 1 is made of gallium arsenide (GaAs) of the binary compound semiconductor. A buffer layer 2 is formed on the semi-insulating GaAs substrate 1. The buffer layer 2 is made of undoped gallium arsenide (GaAs) of the intrinsic binary compound semiconductors. A planar channel layer 3 is deposited on the undoped binary compound GaAs buffer layer 2. The planar channel layer 3 is made of undoped indium gallium arsenide (InGaAs) of the intrinsic ternary compound semiconductors in which a compound ratio of indium (In) to gallium (Ga) is 0.15:0.85, and thus the fraction of In is 0.15, the fraction of Ga is 0.85. A potential barrier layer 4 is formed on the undoped ternary compound InGaAs planar channel layer 3. The potential barrier layer 4 is made of aluminum gallium arsenide(AlGaAs) of the ternary compound semiconductors in which a compound ratio of aluminium (Al) to gallium (Ga) is 0.15:0.85, and thus the fraction of Al is 0.15, the fraction of Ga is 0.85. The ternary compound AlGaAs semiconductors of the potential barrier layer 4 are doped with the n-type dopant. A cap layer 5 is formed on the n-type ternary compound AlGaAs potential barrier layer 4. The cap layer 5 is made of gallium arsenide (GaAe) of binary compound semiconductor which is heavily doped with n-type dopant.

A source contact 6 made of a conductive material is formed on the n-type binary compound GaAs cap layer 5 by using the evaporation, followed by the allowing process thereby resulting in a formation of ohmic contact between the source contact 6 and the undoped ternary compound InGaAs planar channel layer 3. The n-type binary compound GaAs cap layer 5 underlying the source contact 6 serves as a source region. The doping concentrations of the n-type AlGaAs potential barrier layer 4 and the n-type binary compound GaAs cap layer 5 are so determined as to accomplish the ohmic contact between the source contact 6 and the undoped ternary compound InGaAs channel layer 3. But, the dopant concentration of the n-type binary compound GaAs cap layer 5 is higher than that of the n-type ternary compound AlGaAs potential barrier layer 4. For example, the dopant concentration of the n-type binary compound GaAs cap layers 5 is so determined that the binary compound GaAs semiconductor is likely to take the degenerate state.

Further, a drain contact 8 made of a conductive material is formed on the n-type binary compound GaAs cap layer 5 by using the evaporation, followed by the allowing process thereby resulting in a formation of ohmic contact between the drain contact 8 and the undoped ternary compound InGaAs planar channel layer 3. The n-type binary compound GaAs cap layer serves as a drain region. The doping concentrations of the n-type ternary compound AlGaAs potential barrier layer 4 and the n-type binary compound GaAs cap layer 5 are so determined as to accomplish the ohmic contact between the drain contact 8 and the undoped ternary compound InGaAs planar channel layer 3. But, the dopant concentration of the n-type binary compound GaAs cap layer 5 is higher than that of the n-type ternary compound AlGaAs potential barrier layer 4. For example, the dopant concentration of the n-type binary compound GaAs cap layers 5 is so determined that the binary compound GaAs semiconductor is likely to to take the degenerate state. A recess is formed by etching the n-type binary compound GaAs cap layer 5 between the source electrode 6 and the drain electrode 8. A surface of the n-type ternary compound AlGaAs potential barrier layer 4 is exposed in the recess portion.

A gate contact 7 made of a conductive material is formed on the exposed surface of the n-type ternary compound AlGaAs potential barrier layer 4 at the recess portion between the n-type binary compound GaAs cap layers 5 thereby resulting in a formation of schottky barrier contact. The dopant concentration of the n-type ternary compound AlGaAs potential barrier layer 4 is so determined as to form the schottky barrier contact.

FIG. 1B illustrates distributions of both the Al fraction of the n-type ternary compound AlGaAs potential barrier layer 4 and the In fraction of the undoped ternary compound InGaAs planar channel layer 3 in a perpendicular direction to the heterojunction interface.

FIG. 1C illustrates the energy band gap, or the conduction band edge of the n-type ternary compound AlGaAs potential barrier layer 4, the undoped ternary compound InGaAs planar channel layer 3 and the undoped binary compound GaAs buffer layer 2 in the perpendicular direction to the heterojunction interface as well as the distribution of the electron density of the two-dimensional electron gas confined in the one-dimensional potential well, or the quantum well.

The n-type ternary compound AlGaAs potential barrier layer 4 has the wider energy band gap than the energy band gap of the undoped ternary compound InGaAs planar channel layer 3. Thus, the conduction bad edge of the n-type ternary compound AlGaAs potential barrier layer 4 lies above the conduction band edge of the undoped ternary compound InGaAs planar channel layer 3. The conduction band edge of the n-type ternary compound AlGaAs potential barrier layer 4 has a peak at the heterojunction interface to the schottky gate 7 due to the schottky barrier contact.

Conduction band electrons in the n-type ternary compound AlGaAs potential barrier layer 4 are likely to have larger potential energies than the potential energies in the undoped ternary compound InGaAs planar channel layer 3.

Further, the undoped binary compound GaAs buffer layer 2 has the wider energy band gap than the energy band gap of the undoped ternary compound InGaAs planar channel layer 3. Thus, the conduction band edge of the undoped binary compound GaAs buffer layer 2 lies above the conduction band edge of the undoped ternary compound InGaAs planar channel layer 3. The conduction band edge of the undoped binary compound GaAs buffer layer 2 has the uniformity in the level.

Electrons in the conduction band of the n-type ternary compound AlGaAs potential barrier layer 4 move across the heterojunction interface into the undoped ternary compound InGaAs planar channel layer 3. The electrons are confined in the undoped ternary compound InGaAs planar channel layer 3, because the conduction band edge of the the undoped ternary compound InGaAs planar channel layer 3 lies below the conduction band edges of both the n-type ternary compound AlGaAs potential barrier layer 4 and the undoped binary compound GaAs buffer layer 2. Therefore, the undoped ternary compound InGaAs planar channel layer 3 serves as the one-dimensional potential well, or the quantum well, and thus accomplishes the one-dimensional electron confinement in cooperation with the both potential barriers of the n-type ternary compound AlGaAs potential barrier layer 4 and the undoped binary compound GaAs buffer layer 2. The one-dimensional electron confinement in the quantum well forms the two-dimensional electron gas in which the electrons are confined in the one-dimension, for example, in the perpendicular direction to the heterojunction interface, but are able to move freely in the other two-dimensions, for example, in the parallel direction to the heterojunction interface.

Subsequently, the mobility and the sheet electron density of the electrons confined in the quantum well are considered, because the electron mobility and the sheet electron density are most important to the high speed performance of the two-dimensional electron gas field effect transistors.

With respect to the sheet electron density, the deep potential well, or the deep quantum well is permissive of the accomplishment of the strong one-dimensional electron confinement, but the electrons confined in the potential well are able to move freely in the other two-dimensions. The strong one-dimensional electron confinement enables the gain of the sheet electron density. Thus, the deep potential well, or the deep quantum well is able to provide the high sheet electron density to the two-dimensional electron gas confined in the quantum well.

The sheet electron density of the two-dimensional electron gas confined in the quantum well are also associated with the quantum well size which corresponds to the thickness of the undoped ternary compound InGaAs planar channel layer 3. The one-dimensional electron confinement in the quantum well excites a plurality of subbands of the quantum well, concurrently causes the quantization of the electron energies. The each subband energy is inversely proportional to the square of the quantum well size, and thus the thickness of the undoped ternary compound InGaAs planar channel layer 3. Then, the confinement energy of electrons occupying the each energy subband in the quantum well is determined by the difference between the conduction band discontinuity at the hetero-interface and the subband energy in the quantum well. If the quantum well size, and thus the thickness of the undoped ternary compound InGaAs planar channel layer 3 is small, the confinement energy of electrons is decreased. Then, the reduction of the quantum well size, and thus the thickness of the undoped ternary compound InGaAs planar channel layer 3 makes the electron confinement difficult. This also makes the sheet electron density low. In contrast, the large quantum well size, and thus the large thickness of the undoped ternary compound InGaAs planar channel layer 3 contributes the high sheet electron density. The enlargement of the quantum well size, and thus the thickness of the undoped ternary compound InGaAs planar channel layer 3 is desirable to secure a high value of the sheet electron density, provided that the above quantum size effects are appeared.

Eventually, in view of the sheet electron density, the deep and large size potential well is desirable to secure the high sheet electron density. The fulfillment of the desirable deep and large size potential well depends upon the crystal medium of the quantum well, and thus the ternary compound $In_XGa_{1-X}As$, for example, the fraction X of In (indium). The gain of the fraction X of In makes the conduction band edge of the energy band low, and thus the depth of the quantum well large.

With respect to the electron mobility, an increase in the faction X of In in the $In_XGa_{1-X}As$ channel layer is also permissive of having the electron mobility large. The variation of the fraction X of the In causes the change of the crystal structure of the ternary compound InGaAs. The electron mobility depends upon both the effective mass of electrons and the scattering probability of electrons by the crystal lattice oscillations and especially ionized impurities. Both the electron effective mass and the scattering probability are associated with the crystal structure of the ternary compound InGaAs of the planar channel layer 3 serving as the quantum well. The gain of the fraction X of In (indium) in the ternary compound InGaAs makes the electron effective mass small. Thus, the gain of the fraction X of In (indium) in the ternary compound InGaAs is permissive of having the electron mobility large. Therefore, the conclusion is that the gain of the fraction X of In (indium) in the ternary compound InGaAs of the planar channel layer 3 serving as the quantum well is considerable to secure the great electron mobility and the large sheet electron density, both of which realize the excellent high speed or high frequency semiconductor device.

Although the large fraction X of In (indium) in the ternary compound InGaAs provides the above desirable effects in the gains of the electron mobility and of the sheet electron density, it also provides undesirable results. Disadvantages caused by the large fraction X of In (indium) in the ternary compound InGaAs are subsequently described.

Basically, the heterostructure interfaces of the epitaxial compound semiconductor multilayers are engaged with the problem in the lattice mismatch. The lattice mismatch is caused by the difference in the lattice constants. InGaAs and GaAs respectively possess specific lattice constants, which are different each other. Thus, the realization of the perfect lattice match is extremely difficult. The lattice mismatch intends to cause the misfit dislocations in the crystal structure. The misfit dislocations provides various undesirable affections to the property of the two-dimensional electron gas. The gain of the fraction of indium in the ternary compound InGaAs planar channel layer 3 makes the lattice mismatch distinguished thereby causing the many misfit dislocations. The ternary compound InGaAs planar channel layer 3 including the many misfit dislocations no longer serves as the quantum well planar channel layer. Thus, the two-dimensional electron gas confined in the quantum well of the ternary compound InGaAs planar channel layer 3 including the many misfit dislocations no longer possesses the excellent property in the electron mobility and the sheet electron density. Therefore, the two-dimensional electron gas semiconductor devices including the ternary compound InGaAs planar channel layer 3 including the many misfit dislocations no longer possesses the excellent property in the high speed and high frequency performances.

The generation of the misfit dislocations in the crystal is associated with the thickness of the crystal medium layer. Thus, the generation of the misfit dislocation, and thus lattice mismatch depends upon the thickness of the ternary compound InGaAs planar channel layer 3. The misfit dislocations are likely to be generated on condition that the ternary compound InGaAs planar channel layer 3 has a larger thickness than a critical thickness. The suppression of the generation of the misfit dislocations are achievable, when the ternary compound InGaAs planar channel layer 3 has a smaller thickness than the critical thickness. It is thus required that the ternary compound InGaAs planar channel layer 3 has a smaller thickness than the critical thickness. The critical thickness of the misfit dislocation depends upon the fraction of indium in the ternary compound InGaAs of the planar channel layer 3. The gain of the fraction of indium in the ternary compound InGaAs of the planar channel layer 3 makes the critical thickness small. This forces the ternary compound InGaAs of the planar channel layer 3 to limit the thickness into the small critical thickness or less. As described the above, the small thickness of the ternary compound InGaAs of the planar channel layer 3 makes the one-dimensional electron confinement difficult, thereby resulting in the reduction of the sheet electron density. The detail descriptions are omitted, because it is included in the above recitations.

Eventually, the problems with the conventional two-dimensional electron gas field effect transistors are as follows in brief. The realization of the two-dimensional electron gas field effect transistors possessing the high quality performance, and thus the high speed and high frequency performance requires the gain of the fraction of In (indium) in the ternary compound InGaAs planar channel layer 3. However, the gain of the fraction of indium provides the reduction of the critical thickness of the misfit dislocations caused by the large lattice mismatch. The suppression of the generation of the misfit dislocations forces the channel layer thickness to be smaller than the critical thickness, thereby resulting in the smaller channel layer thickness. The smaller channel layer thickness makes the electron confinement difficult thereby resulting in the reduction of the sheet electron density.

To combat the above problems, it is required to develop a novel two-dimensional electron gas field effect transistor including an improved ternary compound InGaAs planar channel layer in which the two-dimensional electron gas possesses a high electron transport property and a high sheet electron density.

SUMMARY OF THE INVENTION

Accordingly, it is a primary object of the present invention to provide a novel compound semiconductor multilayer structure including a two-dimensional electron gas.

It is a further object of the present invention to provide a novel compound semiconductor multilayer structure including a two-dimensional electron gas which possesses a high sheet electron density.

It is still a further object of the present invention to provide a novel compound semiconductor multilayer structure including a two-dimensional electron gas which possesses excellent electron transport properties such as a high electron mobility.

It is another object of the present invention to provide a novel two-dimensional electron gas field effect transistor including an improved compound semiconductor planar channel layer.

It is still another object of the present invention to provide a novel two-dimensional electron gas field effect transistor including an improved compound semiconductor planar channel layer permissive of the two-dimensional electron gas to possess a high sheet electron density.

It is yet another object of the present invention to provide a novel two-dimensional electron gas field effect transistor including an improved compound semiconductor planar channel layer permissive of the two-dimensional electron gas to possess excellent electron transport properties such as a high electron mobility.

The above and other objects, features and advantages of the present invention will be apparent from following descriptions.

The present invention provides a compound semiconductor multilayer structure having a two-dimensional electron gas comprising: a first potential barrier being made of a first energy band gap semiconductor material; a second potential barrier being made of a second energy band gap semiconductor material; and a quantum well layer having opposite interfaces abutting the first and second potential barriers, the quantum well layer being made of a third energy band gap compound semiconductor material, the third energy band gap being smaller than the first and second energy band gaps, the third energy band gap having a variation in a perpendicular direction to the interfaces with taking a minimum value at a portion except for adjacent portions to the interfaces.

The present invention also provides a field effect transistor having a two-dimensional electron gas comprising: a semi-insulating bulk; the above compound semiconductor multilayer structure formed on the bulk, source and drain regions formed on the first potential barrier layer, and a gate contact formed on the first potential barrier layer. The first potential barrier layer is doped with n-type dopant. The second potential barrier layer is not doped to serve as a buffer layer.

The third compound semiconductor material also comprises ternary compound $In_XGa_{1-X}As$, the fraction X of In having a variation in a perpendicular direction to the interfaces with taking a maximum value at a portion except for adjacent portions to the interfaces, for example, a portion having a distance in the range from 30 angstroms to 110 angstroms from the interface to the first potential barrier. Further, a step-graded variation of the fraction X of In in the ternary compound $In_XGa_{1-X}As$ is available.

The distribution of the electron density of the two-dimensional electron gas in the perpendicular direction to the heterojunction interface tends to take a maximum value, and thus have a peak at a portion having a distance of approximately 50 angstroms from the heterojunction interface between the quantum well layer and the first potential barrier layer. The centroid of gravity of the two-dimensional electron gas exists at a position having a distance of 80 angstroms from the heterojunction interface between the quantum well layer and the first potential barrier layer. Those matter are reported by F. Stern at al. in 1984 July, Physical Review B, Vol. 30, pp.840-848.

The fraction X of In in the ternary compound InGaAs of the quantum well layer takes large values in the vicinity of the portion at which the electron density takes a maximum value. The fraction X of In also takes small values in the vicinity of the heterojunction interfaces at which the electron density takes small values. The average of the fraction X of In in the ternary compound InGaAs is reduced thereby preventing the reduction of the critical thickness. This allows accomplishing the strong electron confinement of the two-dimensional electron gas. Further, the strong electron confinement and the great electron mobility are realized by the large fraction X of In in the ternary compound InGaAs at the electron density large portion. Thus, such variation of the fraction X of In in the ternary compound InGaAs of the quantum well layer provides excellent performances such as high speed and high frequency performances to the two-dimensional electron gas field effect transistor.

BRIEF DESCRIPTION OF THE DRAWINGS

Preferred embodiments of the present invention will hereinafter fully be described in detail with reference to the accompanying drawings.

FIG. 2B is diagrams of the fraction of indium in ternary compound InGaAs of a quantum well planar channel layer and the fraction of aluminium in ternary compound AlGaAs of a potential barrier layer of a first embodiment according to the present invention.

FIG. 2C is diagrams of the distribution of the electron density of the two-dimensional electron gas and an energy band structure of a quantum well planar channel layer and potential barrier layers of a first embodiment according to the present invention.

PREFERRED EMBODIMENTS OF THE INVENTION

The present invention basically intends to provide a novel compound semiconductor multilayer structure having a two-dimensional electron gas possessing excellent electron transport property such as a high electron mobility and a high sheet electron density. The novel compound semiconductor multilayer structure provided by the present invention is applicable to quantum well devices such as two-dimensional electron gas field effect transistors. The two-dimensional electron gas field effect transistor including an improved compound semiconductor multilayer structure provided by the present invention is described as preferred embodiments of the present invention.

A first embodiment of the present invention will be described with reference to FIGS. 2A, 2B and 2C.

Figure 1A:
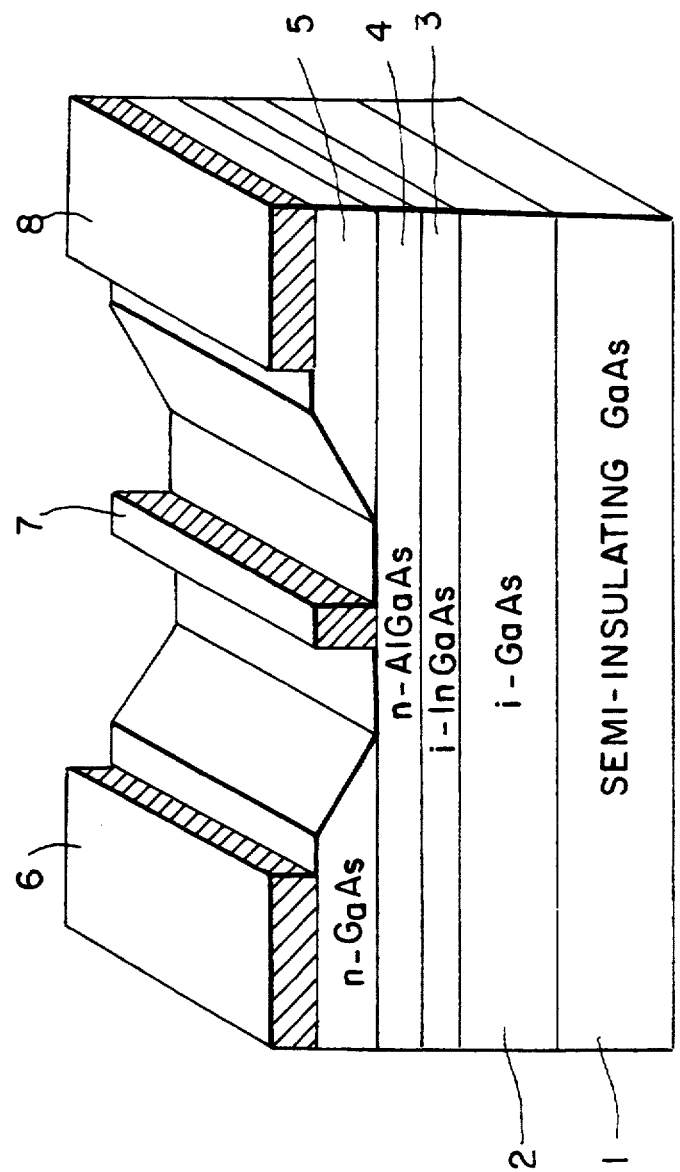
FIG. 1A is a fragmentary cross sectional elevation view illustrative of the conventional structure of the two-dimensional electron gas field effect transistor.
Figure 1B:
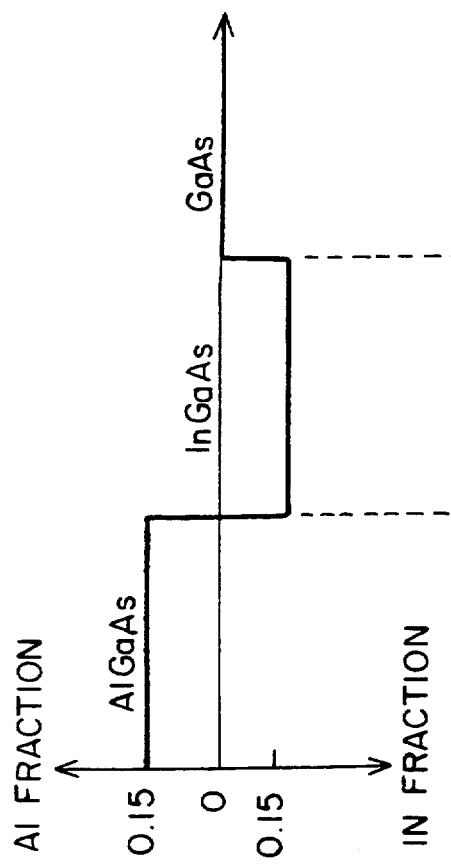
FIG. 1B is diagrams of the fraction of indium in ternary compound InGaAs of the quantum well planar channel layer and the fraction of aluminium in ternary compound AlGaAs of the potential barrier layer in the prior art.
Figure 1C:
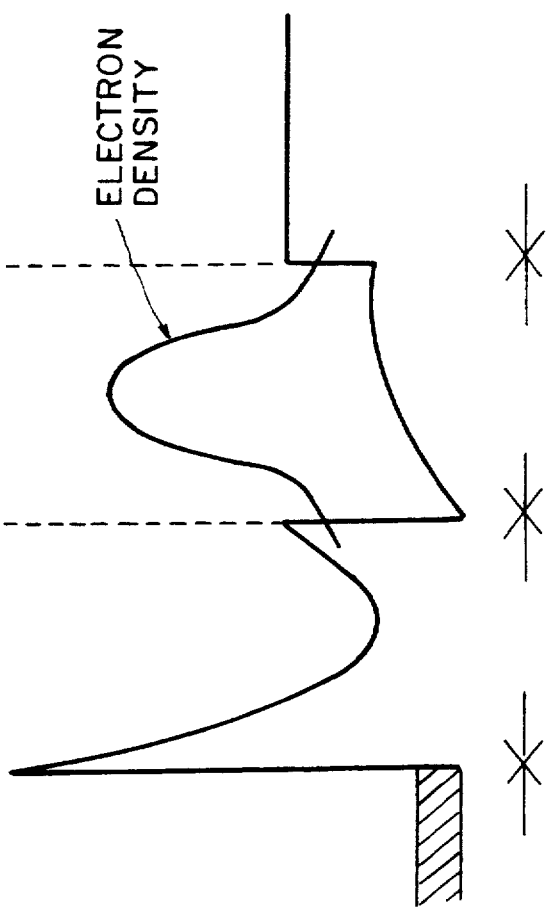
FIG. 1C is diagrams of the distribution of the electron density of the two-dimensional electron gas in the perpendicular direction to the heterojunction interface and the energy band structure of the quantum well planar channel layer and the potential barrier layers in the prior art.
Figure 2A:
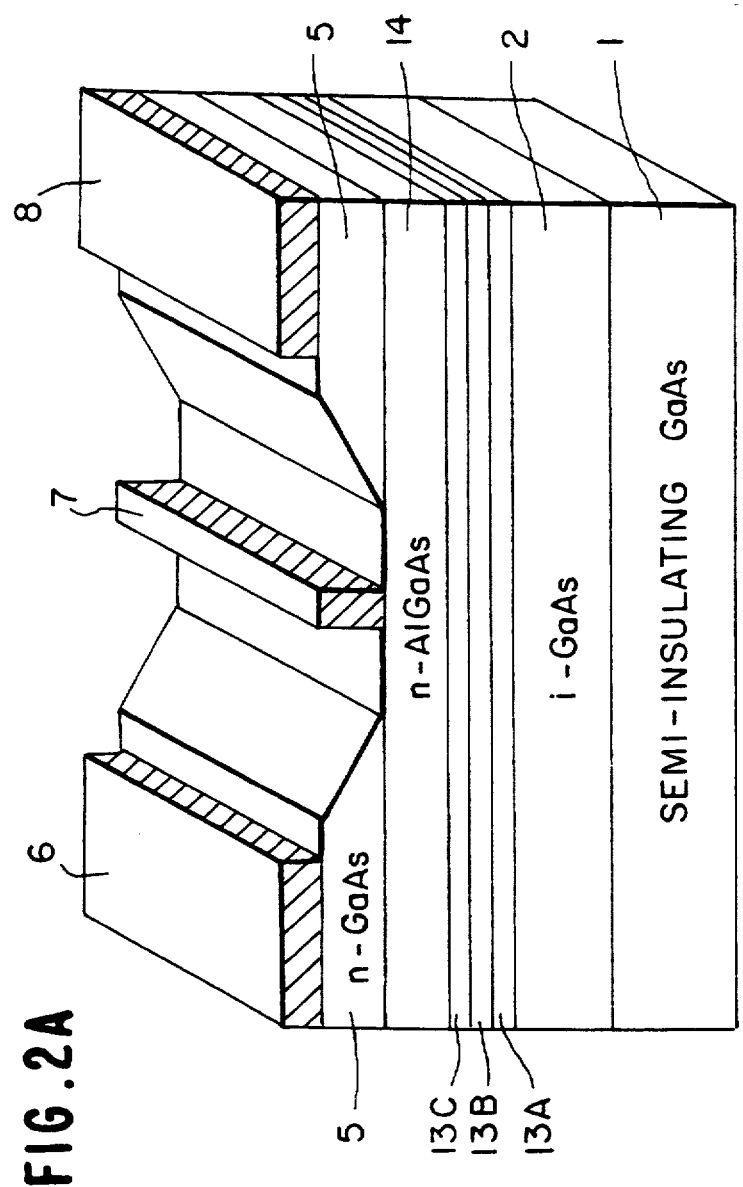
FIG. 2A is a fragmentary cross sectional elevation view illustrative of a novel structure of a two-dimensional electron gas field effect transistor of a first embodiment according to the present invention.

With reference to FIG. 2A, a semi-insulating substrate 1 is prepared to form epitaxial multilayers of compound semiconductors. The molecular beam epitaxy (MBE) is applicable to form the compound semiconductor epitaxial multilayers. The semi-insulating substrate 1 is made of gallium arsenide (GaAs) of the binary compound semiconductor. A buffer layer 2 having a thickness of approximately 1 micrometer is formed on the semi-insulating GaAs substrate 1. The buffer layer 2 is made of undoped gallium arsenide (GaAs) of the intrinsic binary compound semiconductors.

A planar channel layer is deposited on the undoped binary compound GaAs buffer layer 2. The planar channel layer comprises three layers 13A, 13B and 13C. The three planar channel layers 13A, 13B and 13C are made of undoped indium gallium arsenide ($In_XGa_{1-X}As$) of the intrinsic ternary compound semiconductors, but the fractions $X_1 1$, $X_2$ and $X_3$ of In (indium) are different each other. For example, the fraction $X_1$ of In (indium) in the planar channel layer 13A is 0.1. The fraction $X_2$ of In (indium) in the planar channel layer 13B is 0.3. The fraction $X_3$ of In (indium) in the planar channel layer 13C is 0.1. Each of the planar channel layers 13A, 13B and 13C has a thickness of approximately 50 angstroms. Thus, the average of the In (indium) fractions of $X_1$, $X_2$ and $X_3$ is 0.16. The total thickness of the three planar channel layers 13A, 13B and 13C is 150 angstroms. Under the above In (indium) fractions, the critical thickness of the misfit dislocation is approximately 200 angstroms. Thus, the total thickness of the three planar channel layers 13A, 13B and 13C is smaller than the critical thickness of the misfit dislocation. Therefore, the undoped ternary compound InGaAs planner channel layers 13A, 13B and 13C are free from disadvantages caused by the misfit dislocations.

A potential barrier layer 14 having a thickness of approximately 350 angstroms is formed on the undoped ternary compound InGaAs planar channel layers 13A, 13B and 13C. The potential barrier layer 14 is made of aluminium gallium arsenide ($Al_YGa_{1-Y}As$) of the ternary compound semiconductors in which the fraction Y of Al (aluminium) is 0.15, the fraction of Ga (gallium) is 0.85. The ternary compound AlGaAs semiconductors of the potential barrier layer 14 are doped with the n-type dopant at a doping concentration of approximately $1.5 \times 10^{18}/cm^3$.

A Cap layer 5 having a thickness of approximately 500 angstroms is formed on the n-type ternary compound AlGaAs potential barrier layer 14. The cap layer 5 is made of gallium arsenide (GaAs) of binary compound semiconductor which is heavily doped with n-type dopant at a doping concentration of approximately $5 \times 10^{18}/cm^3$.

A source contact 6 made of a conductive material is formed on the n-type binary compound GaAs cap layer 5 by using the evaporation, followed by alloying process thereby resulting in a formation of ohmic contact between the source contact 6 and the undoped ternary compound InGaAs planar channel layers 13A, 13B and 13C. The n-type binary compound GaAs cap layer 5 underlying the source contact 6 serves as a source region. The above doping concentrations of the n-type AlGaAs potential barrier layer 14 and the n-type binary compound GaAs cap layer 5 were so determined as to accomplish the ohmic contact between the source contact 6 and the undoped ternary compound InGaAs channel layers 13A, 13B and 13C.

Further, a drain contact 8 made of a conductive material is formed on yhe n-type binary compound GaAs cap layer 5 by using the evaporation, followed by the allowing process, thereby resulting in a formation of ohmic contact between the drain contact 8 and the undoped ternary compound InGaAs planar channel layers 13A, 13B and 13C. The n-type binary compound GaAs cap layer serves as a drain region. The above doping concentrations of the n-type ternary compound AlGaAs potential barrier layer 14 and the n-type binary compound GaAs cap layer 5 were so determined as to accomplish the ohmic contact between the drain contact 8 and the undoped ternary compound InGaAs planar channel layers 13A, 13B and 13C. A recess is formed by ethcing the n-type binary compound GaAs cap layer 5 between the source electrode 6 and the drain electrode 8. A surface of the n-type ternary compound AlGaAs potential barrier layer 14 is exposed in the recess portion.

A gate contact 7 made of a conductive material is formed on the exposed surface of the n-type ternary compound AlGaAs potential barrier layer 14 at the recess portion between the n-type binary compound GaAs cap layers 5 thereby resulting in a formation of schottky barrier contact. The above dopant concentration of the n-type ternary compound AlGaAs potential barrier layer 14 was so determined as to form the schottky barrier contact.

FIG. 2B illustrates distributions of both the Al (aluminium) fraction Y of the n-type ternary compound AlGaAs potential barrier layer 14 and the In (indium) fraction of the undoped ternary compound InGaAs planar channel layers 13A, 13B and 13C in a perpendicular direction to the heterojunction interface.

FIG. 2C illustrates the energy band gap structure, or the conduction band edge of the n-type ternary compound AlGaAs potential barrier layer 14, the undoped ternary compound InGaAs planar channel layers 13A, 13B and 13C and the undoped binary compound GaAs buffer layer 2 in the perpendicular direction to the heterojunction interface as well as the distribution of the electron density of the two-dimensional electron gas confined in the one-dimensional potential well, or the quantum well.

The distribution of the electron density takes a maximum value at a portion having a distance in the range from 50 to 100 angstroms from the heterojunction interface between the n-type ternary compound AlGaAs potential barrier layer 14 and the undoped ternary compound InGaAs planar channel layers 13A, 13B and 13C. The electron density of the two-dimensional electron gas takes large values in the planar channel layer 13B.

The conduction band edge of the n-type ternary compound AlGaAs potential barrier layer 14 lies above the step-graded conduction band edges of the undoped ternary compound InGaAs planar channel layers 13A, 13B and 13C. The conduction band edge of the n-type ternary compound AlGaAs potential barrier layer 14 has a peak at the heterojunction interface to the schottky gate 7 due to the schottky barrier contact.

Further, the conduction band edge of the undoped binary compound GaAs buffer layer 2 lies above the conduction band edge of the undoped ternary compound InGaAs planar channel layers 13A, 13B and 13C.

The conduction band edge of the undoped binary compound GaAs buffer layer 2 has the uniformity in the level.

Thus, the electrons are confined in the undoped ternary compound InGaAs planar channel layers 13A, 13B and 13C. Therefore, the undoped ternary compound InGaAs planar channel layers 13A, 13B and 13C serve as the one-dimensional step-graded potential well, or the step-graded quantum well, and thus accomplish the one-dimensional electron confinement in cooperation with the both potential barriers of the n-type ternary compound AlGaAs potential barrier layer 14 and the undoped binary compound GaAs buffer layer 2.

With respect to the step-graded potential well, the conduction band edge of the planar channel layer 13B lies below the conduction band edges of the other planar channel layers 13A and 13C. Thus, the potential band is most deep in the planar channel layer 13B. Electrons of the two-dimensional electron gas in the planar channel layer 13B are most strongly confined in the quantum well. Further, electrons confined most strongly in the planar channel layer 13B possess most great mobility due to the highest In content. The distribution of the electron density has a peak in the planar channel layer 13B. Thus, the major electrons in the confined two-dimensional electron gas exist in the planar channel layer 13B. Therefore, the major electrons in the planar channel layer 13B possess great mobility, in addition are strongly confined, thereby providing a high sheet electron density. As compared to the prior art, the effective electron mobility and the effective sheet electron density are great considerably.

The fraction X of In (indium) in ternary compound InGaAs takes low values in the planar channel layers 13A and 13C, although the fraction X of In (indium) takes high values in the planar channel layer 13B. This suppresses the average of the fraction X in the planar channel layers 13A, 13B and 13C to be higher, thereby realizing the smaller total thickness of the planar channel layers 13A, 13B and 13C than the critical thickness of the misfit dislocations. Therefore, the undoped ternary compound InGaAs planner channel layers 13A, 13B and 13C are free from the misfit dislocations caused by the lattice mismatch.

Eventually, the step-graded potential band structure of the planar channel layers 13A, 13B and 13C realizes a high sheet electron density and excellent electron transport property such as a high electron mobility without misfit dislocation caused by the lattice mismatch.

A second embodiment of the present invention will be described with reference to FIGS. 3A, 3B and 3C.

The structure of the two-dimensional electron gas field effect transistor of the second embodiment of the present invention is analogous to that of the above first embodiment, except for the planar channel layer serving as the quantum well in which the two-dimensional electron gas is confined. Thus, the structure will subsequently be described, but only the planar channel layer and the potential barrier layer.

Figure 3A:
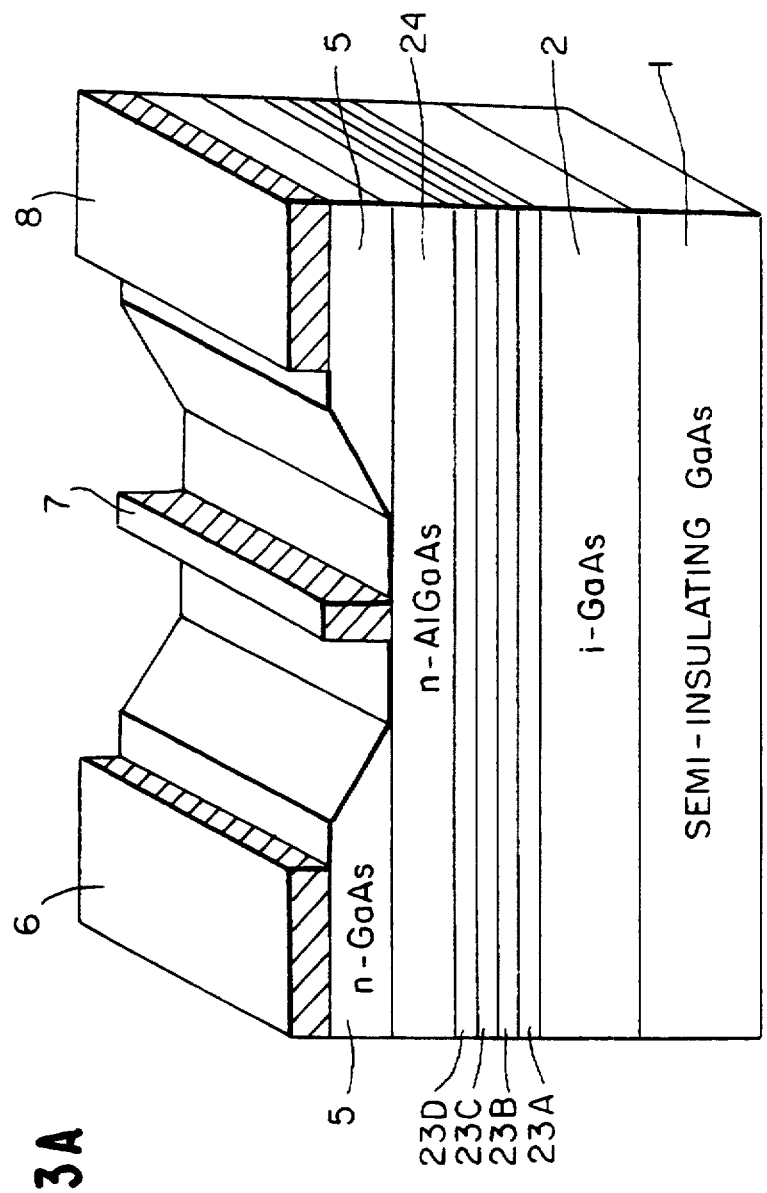
FIG. 3A is a fragmentary cross sectional elevation view illustrative of a novel structure of a two-dimensional electron gas field effect transistor of a second embodiment according to the present invention.

With reference to FIG. 3A, a planar channel layer comprises four layers 23A, 23B, 23C and 23D. The four planar channel layers 23A, 23B, 23C and 23D are made of undoped indium gallium arsenide ($In_XGa_{1-X}As$) of the intrinsic ternary compound semiconductors, but the fractions $X_1$, $X_2$, $X_3$ and $X_4$ of In (indium) are different each other. For example, the fraction $X_1$ of In (indium) in the planar channel layer 23A is 0.1. The fraction $X_2$ of In (indium) in the planar channel layer 23B is 0.2. The fraction $X_3$ of In (indium) in the planar channel layer 23C is 0.3. The fraction $X_4$ of In (indium) in the planar channel layer 23D is 0.1. Each of the planar channel layers 23A, 23B, 23C and 23D has a thickness of approximately 40 angstroms. Thus, the average of the In (indium) fractions of $X_1$, $X_2$, $X_3$ and $X_4$ is 0.175. The total thickness of the four planar channel layers 23A, 23B, 23C and 23D is 160 angstroms. Under the above In (indium) fractions, the critical thickness of the misfit dislocation is approximately 180 angstroms. Thus, the total thickness of the four planar channel layers 23A, 23B. 23C and 23D is smaller than the critical thickness of the misfit dislocation. Therefore, the undoped ternary compound InGaAs planner channel layers 23A, 23B, 23C and 23D are free from disadvantages caused by the misfit dislocations.

A potential barrier layer 24 having a thickness of approximately 250 angstroms is formed on the undoped ternary compound InGaAs planar channel layers 23A, 23B, 23C and 23D. The potential barrier layer 24 is made of aluminium gallium arsenide ($Al_YGa_{1-Y}As$) of the ternary compound semiconductors in which the fraction Y of Al (aluminium) is 0.3, the fraction of Ga (gallium) is 0.7. The ternary compound AlGaAs semiconductors of the potential barrier layer 24 are doped with the n-type dopant at a doping concentration of approximately $3 \times 10^{18}/cm^3$.

Figure 3B:
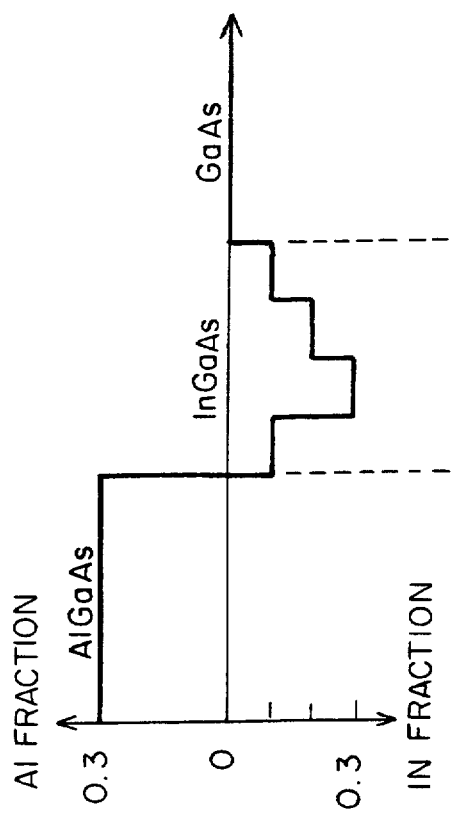
FIG. 3B is diagrams of the fraction of indium in ternary compound InGaAs of a quantum well planar channel layer and the fraction of aluminium in ternary compound AlGaAs of a potential barrier layer of a second embodiment according to the present invention.

FIG. 3B illustrates distributions of both the Al (aluminium) fraction Y of the n-type ternary compound AlGaAs potential barrier layer 24 and the In (indium) fraction of the undoped ternary compound InGaAs planar channel layers 23A, 23B, 23C and 23D in a perpendicular direction to the heterojunction interface.

Figure 3C:
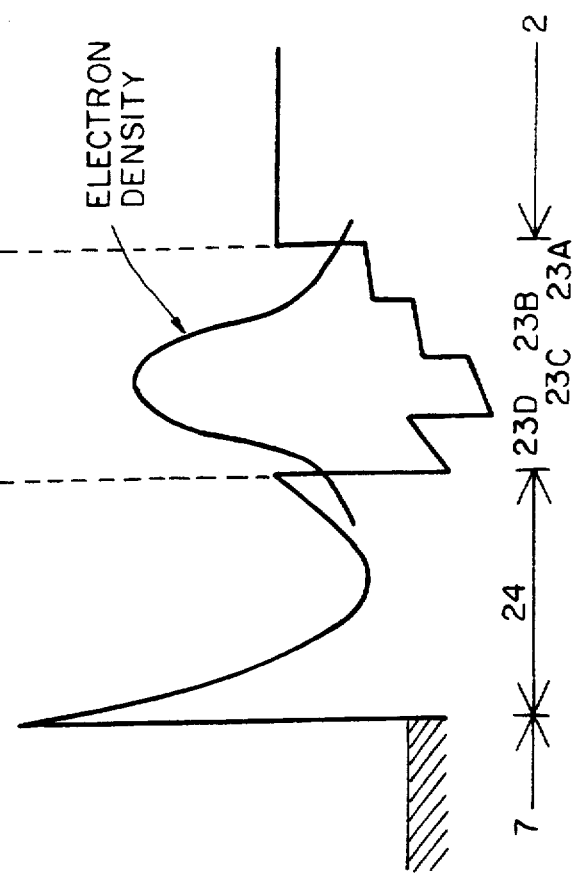
FIG. 3C is diagrams of the distribution of the electron density of the two-dimensional electron gas and an energy band structure of a quantum well planar channel layer and potential barrier layers of a second embodiment according to the present invention.

FIG. 3C illustrates the energy band gap structure, or the conduction band edge of the n-type ternary compound AlGaAs potential barrier layer 24, the undoped ternary compound InGaAs planar channel layers 23A, 23B, 23C and 23D and the undoped binary compound GaAs buffer layer 2 in the perpendicular direction to the heterojunction interface as well as the distribution of the electron concentration of the two-dimensional electron gas confined in the one-dimensional potential well, or the quantum well.

The distribution of the electron density takes a maximum value at a portion having a distance in the range from 50 to 100 angstroms from the heterojunction interface between the n-type ternary compound AlGaAs potential barrier layer 24 and the undoped ternary compound InGaAs planar channel layers 23A, 23B, 23C and 23D. The electron density of the two-dimensional electron gas takes large values in or in the vicinity of the planar channel layer 23C.

The conduction band edge of the n-type ternary compound AlGaAs potential barrier layer 24 lies above the step-graded conduction band edges of the undoped ternary compound InGaAs planar channel layers 23A, 23B, 23C and 23D. The conduction bad edge of the n-type ternary compound AlGaAs potential barrier layer 24 has a peak at the heterojunction interface to the schottky gate 7 due to the schottky barrier contact.

Further, the conduction band edge of the undoped binary compound GaAs buffer layer 2 lies above the conduction band edge of the undoped ternary compound InGaAs planar channel layers 23A, 23B, 23C and 23D. The conduction band edge of the undoped binary compound GaAs buffer layer 2 has the uniformity in the level.

Thus, the electrons are confined in the undoped ternary compound InGaAs planar channel layers 23A, 23B, 23C and 23D. Therefore, the undoped ternary compound InGaAs planar channel layers 23A, 23B, 23C and 23D serve as the one-dimensional step-graded potential well, or the step-graded quantum well, and thus accomplish the one-dimensional electron confinement in cooperation with the both potential barriers of the n-type ternary compound AlGaAs potential barrier layer 24 and the undoped binary compound GaAs buffer layer 2.

With respect to the step-graded potential well, the conduction band edge of the planar channel layer 23B lies below the conduction band edges of the planar channel layer 23A. The conduction band edge of the planar channel layer 23C lies below the conduction band edges of the planar channel layers 23B and 23D. Thus, the potential band is most deep in the planar channel layer 23C. Electrons of the two-dimensional electron gas in the planar channel layer 23C are most strongly confined in the quantum well. Further, electrons confined most strongly in the planar channel layer 23C possess most great mobility due to the highest I content. The distribution of the electron density has a peak in or in the vicinity of the planar channel layer 23C. Thus, the major electrons in the confined two-dimensional electron gas exist in the planar channel layers 23B and 23C. Therefore, the major electrons in the planar channel layers 23B and 23C possess great mobility, in addition are strongly confined, thereby providing a high sheet electron density. As compared to the prior art, the effective electron mobility and the effective sheet electron density are great considerably.

The fraction X of In (indium) in ternary compound InGaAs takes low values in the planar channel layers 23A and 23D, although the fraction X of In (indium) takes high values in the planar channel layer 23C. This suppresses the average of the fraction X in the planar channel layers 23A, 23B, 23C and 23D to be higher, thereby realizing the smaller total thickness of the planar channel layers 23A, 23B, 23C and 23D than the critical thickness of the misfit dislocations. Therefore, the undoped ternary compound InGaAs planner channel layers 23A, 23B, 23C and 23D are free from the misfit dislocations caused by the lattice mismatch.

Eventually, the step-graded potential band structure of the planar channel layers 23A, 23B, 23C and 23D realizes a high sheet electron density and excellent electron transport property such as a high electron mobility without misfit dislocation caused by the lattice mismatch.

A third embodiment of the present invention will be described with reference to FIGS. 4A, 4B and 4C.

The structure of the two-dimensional electron gas field effect transistor of the third embodiment of the present invention is analogous to that of the above first embodiment, except for the planar channel layer serving as the quantum well in which the two-dimensional electron gas is confined. Thus, the structure will subsequently be described, but only the planar channel layer and the potential barrier layer.

Figure 4A:
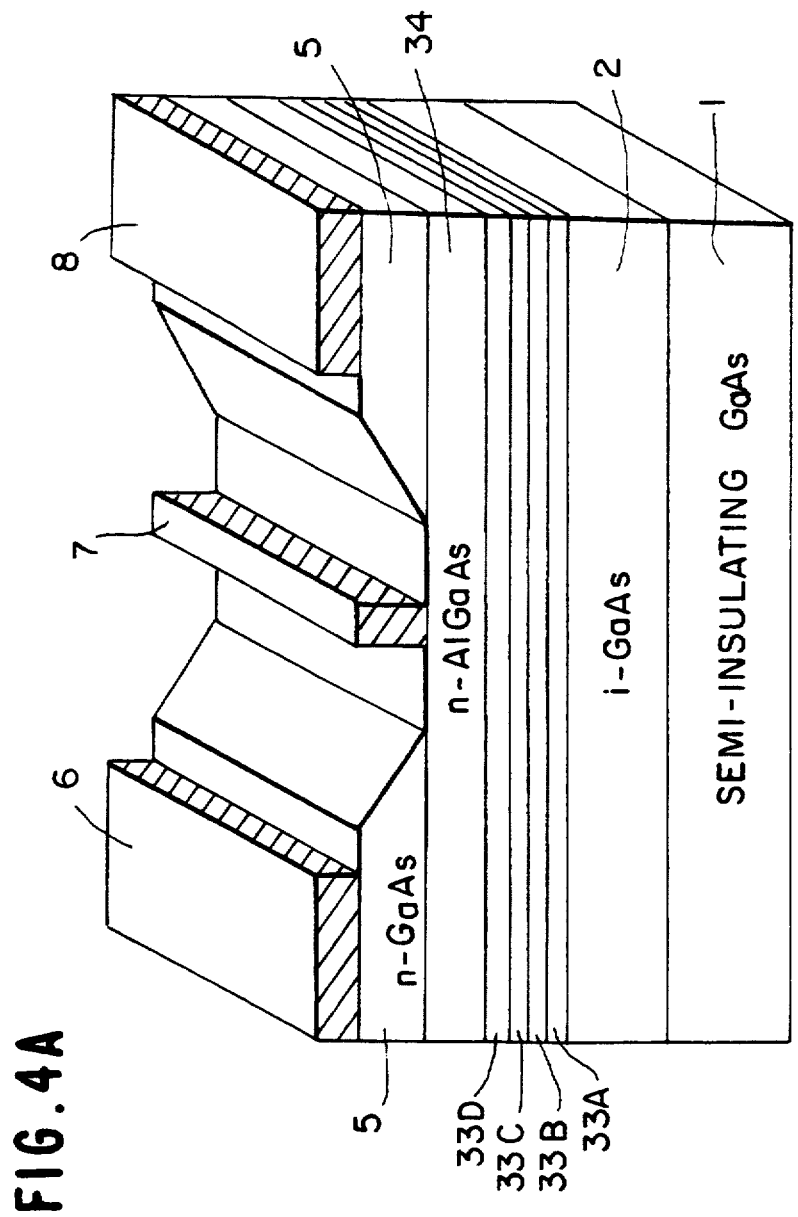
FIG. 4A is a fragmentary cross sectional elevation view illustrative of a novel structure of a two-dimensional electron gas field effect transistor of a third embodiment according to the present invention.

With reference to FIG. 4A, a planar channel layer comprises four layers 33A, 33B, 33C and 33D. The four planar channel layers 33A, 33B, 33C and 33D are made of undoped indium gallium arsenide ($In_XGa_{1-X}As$) of the intrinsic ternary compound semiconductors, but the fractions $X_1$, $X_2$, $X_3$ and $X_4$ of In (indium) are different each other. For example, the fraction $X_1$ of In (indium) in the planar channel layer 33A is 0.1. The fraction $X_2$ of In (indium) in the planar channel layer 33B is 0.3. The fraction $X_3$ of In (indium) in the planar channel layer 33C is 0.2. The fraction $X_4$ of In (indium) in the planar channel layer 33D is 0.1. Each of the planar channel layers 33A, 33B, 33C and 33D has a thickness of approximately 40 angstroms. Thus, the average of the In (indium) fractions of $X_1$, $X_2$, $X_3$ and $X_4$ is 0.175. The total thickness of the four planar channel layers 33A, 33B, 33C and 33D is 160 angstroms. Under the above In (indium) fractions, the critical thickness of the misfit dislocation is approximately 180 angstroms. Thus, the total thickness of the four planar channel layers 33A, 33B, 33C and 33D is smaller than the critical thickness of the misfit dislocation. Therefore, the undoped ternary compound InGaAs planner channel layers 33A, 33B, 33C and 33D are free from disadvantages caused by the misfit dislocations.

A potential barrier layer 34 having a thickness of approximately 250 angstroms is formed on the undoped ternary compound InGaAs planar channel layers 33A, 33B, 33C and 33D. The potential barrier layer 34 is made of aluminium gallium arsenide ($Al_YGa_{1-Y}As$) of the ternary compound semiconductors in which the fraction Y of Al (aluminium) is 0.3, the fraction of Ga (gallium) is 0.7. The ternary compound AlGaAs semiconductors of the potential barrier layer 34 are doped with the n-type dopant at a doping concentration of approximately $3 \times 10^{18}/cm^3$.

Figure 4B:
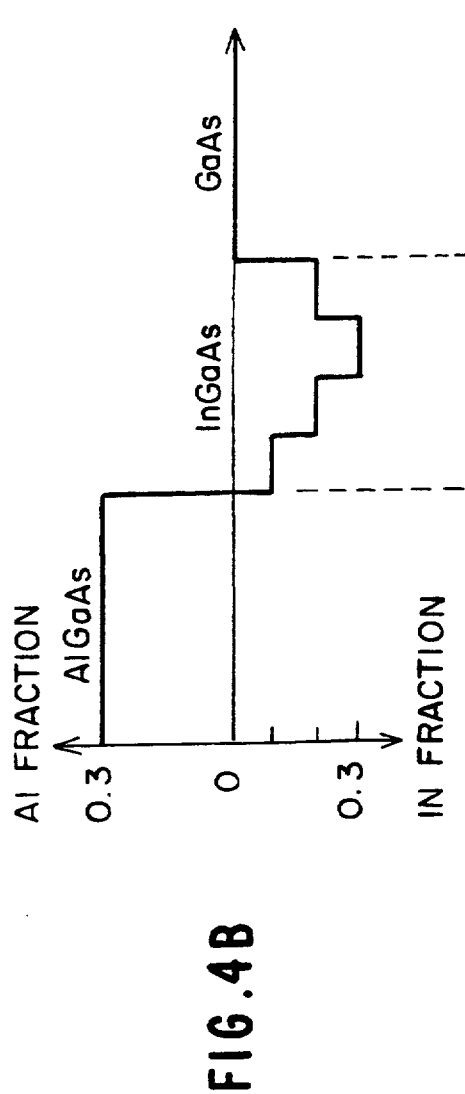
FIG. 4B is diagrams of the fraction of indium in ternary compound InGaAs of a quantum well planar channel layer and the fraction of aluminium in ternary compound AlGaAs of a potential barrier layer of a third embodiment according to the present invention.

FIG. 4B illustrates distributions of both the Al (aluminium) fraction Y of the n-type ternary compound AlGaAs potential barrier layer 34 and the In (indium) fraction of the undoped ternary compound InGaAs planar channel layers 33A, 33B, 33C and 33D in a perpendicular direction to the heterojunction interface.

Figure 4C:
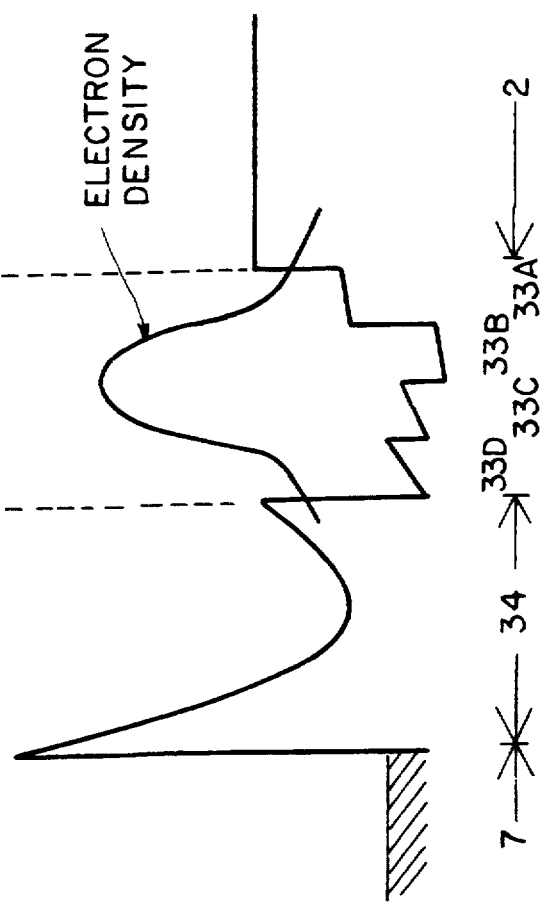
FIG. 4C is diagrams of the distribution of the electron density of the two-dimensional electron gas and an energy band structure of a quantum well planar channel layer and potential barrier layers of a third embodiment according to the present invention.

FIG. 4C illustrates the energy band gap structure, or the conduction band edge of the n-type ternary compound AlGaAs potential barrier layer 34, the undoped ternary compound InGaAs planar channel layers 33A, 33B, 33C and 33D and the undoped binary compound GaAs buffer layer 2 in the perpendicular direction to the heterojunction interface as well as the distribution of the electron concentration of the two-dimensional electron gas confined in the one-dimensional potential well, or the quantum well. The distribution of the electron density takes a maximum value at a portion having a distance in the range from 50 to 100 angstroms from the heterojunction interface between the n-type ternary compound AlGaAs potential barrier layer 34 and the undoped ternary compound InGaAs planar channel layers 33A, 33B, 33C and 33D. The electron density of the two-dimensional electron gas takes large values in or in the vicinity of the planar channel layer 33B.

The conduction band edge of the n-type ternary compound AlGaAs potential barrier layer 34 lies above the step-graded conduction band edges of the undoped ternary compound InGaAs planar channel layers 33A, 33B, 33C and 33D. The conduction band edge of the n-type ternary compound AlGaAs potential barrier layer 34 has a peak at the heterojunction interface to the schottky gate 7 due to the schottky barrier contact.

Further, the conduction band edge of the undoped binary compound GaAs buffer layer 2 lies above the conduction band edge of the undoped ternary compound InGaAs planar channel layers 33A, 33B, 33C and 33D. The conduction band edge of the undoped binary compound GaAs buffer layer 2 has the uniformity in the level.

Thus, the electrons are confined in the undoped ternary compound InGaAs planar channel layers 33A, 33B, 33C and 33D. Therefore, the undoped ternary compound InGaAs planar channel layers 33A, 33B, 33C and 33D serve as the one-dimensional step-graded potential well, or the step-graded quantum well, and thus accomplish the one-dimensional electron confinement in cooperation with the both potential barriers of the n-type ternary compound AlGaAs potential barrier layer 34 and the undoped binary compound GaAs buffer layer 2.

With respect to the step-graded potential well, the conduction band edge of the planar channel layer 33B lies below the conduction band edges of the planar channel layer 33A. The conduction band edge of the planar channel layer 33C lies above the conduction band edges of the planar channel layers 33B. The conduction band edge of the planar channel layer 33D lies above the conduction band edges of the planar channel layers 33C. Thus, the potential band is most deep in the planar channel layer 33B. Electrons of the two-dimensional electron gas in the planar channel layer 33B are most strongly confined in the quantum well. Further, electrons confined most strongly in the planar channel layer 33B possess most great mobility due to the highest In content. The distribution of the electron density has a peak in or in the vicinity of the planar channel layer 33B. Thus, the major electrons in the confined two-dimensional electron gas exist in the planar channel layers 33B and 33C. Therefore, the major electrons in the planar channel layers 33B and 33C possess great mobility, in addition are strongly confined, thereby providing a high sheet electron density. As compared to the prior art, the effective electron mobility and the effective sheet electron density are great considerably.

The fraction X of In (indium) in ternary compound InGaAs takes low values in the planar channel layers 33A and 33D, although the fraction X of In (indium) takes high values in the planar channel layer 33B. This suppresses the average of the fraction X in the planar channel layers 33A, 33B, 33C and 33D to be higher, thereby realizing the smaller total thickness of the planar channel layers 33A, 33B, 33C and 33D than the critical thickness of the misfit dislocations. Therefore, the undoped ternary compound InGaAs planner channel layers 33A, 33B, 33C and 33D are free from the misfit dislocations caused by the lattice mismatch.

Eventually, the step-graded potential band structure of the planar channel layers 33A, 33B, 33C and 33D realizes a high sheet electron density and excellent electron transport property such as a high electron mobility without misfit dislocation caused by the lattice mismatch.

A fourth embodiment of the present invention will be described with reference to FIGS. 5A and 58.

The structure of the two-dimensional electron gas field effect transistor of the fourth embodiment of the present invention is analogous to that of the above first embodiment, except for the planar channel layer serving as the quantum well in which the two-dimensional electron gas is confined. Thus, the structure will subsequently be described, but only the planar channel layer and the potential barrier layer.

Figure 5A:
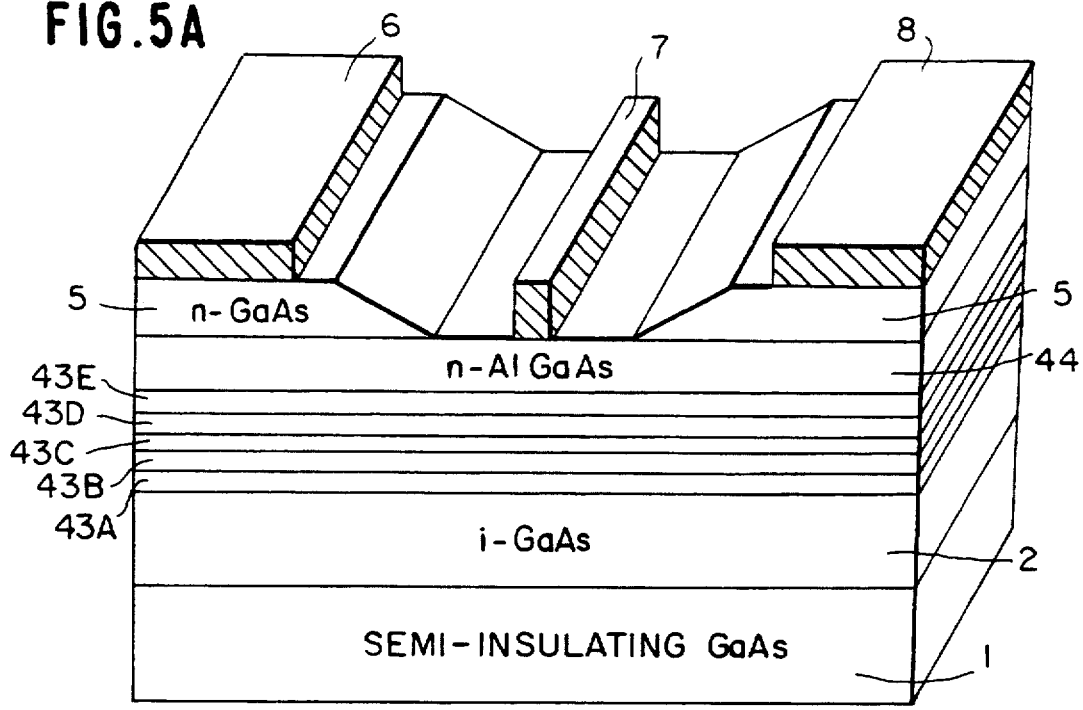
FIG. 5A is a fragmentary cross sectional elevation view illustrative of a novel structure of a two-dimensional electron gas field effect transistor of a fourth embodiment according to the present invention.

With reference to FIG. 5A, a planar channel layer comprises five layers 43A, 43B, 43C, 43D and 43E. The five planar channel layers 43A, 43B, 43C, 43D and 43E are made of undoped indium gallium arsenide ($In_XGa_{1-X}As$) of the intrinsic ternary compound semiconductors, but the fractions $X_1$, $X_2$, $X_3$, $X_4$ and $X_5$ of In (indium) are different each other. For example, the fraction $X_1$ of In (indium) in the planar channel layer 43A is 0.06. The fraction $X_2$ of In (indium) in the planar channel layer 43B is 0.1. The fraction $X_3$ of In (indium) in the planar channel layer 43C is 0.14. The fraction $X_4$ of In (indium) in the planar channel layer 43D is 0.5. The fraction $X_5$ of In (indium) in the planar channel layer 43E is 0.1. Each of the planar channel layers 43A, 43B, 43C, 43D and 43E has a thickness of approximately 30 angstroms. Thus, the average of the In (indium) fractions of $X_1$, $X_2$, $X_3$, $X_4$ and $X_5$ is 0.18. The total thickness of the five planar channel layers 43A, 43B, 43C, 43D and 43E is 150 angstroms Under the above In (indium) fractions, the critical thickness of the misfit dislocation is approximately 170 angstroms Thus, the total thickness of the five planar channel layers 43A, 438, 43C, 43D and 43E is smaller than the critical thickness of the misfit dislocation. Therefore, the undoped ternary compound InGaAs planner channel layers 43A, 43B, 43C, 43D and 43E are free from disadvantages caused by the misfit dislocations.

A potential barrier layer 44 having a thickness of approximately 250 angstroms is formed on the undoped ternary compound InGaAs planar channel layers 43A, 43B, 43C, 43D and 43E. The potential barrier layer 44 is made of aluminium gallium arsenide ($Al_YGa_{1-Y}As$) of the ternary compound semiconductors in which the fraction Y of Al (aluminium) is 0.3, the fraction of Ga (gallium) is 0.7. The ternary compound AlGaAs semiconductors of the potential barrier layer 44 are doped with the n-type dopant at a doping concentration of approximately $3 \times 10^{18}/cm^3$.

Figure 5B:
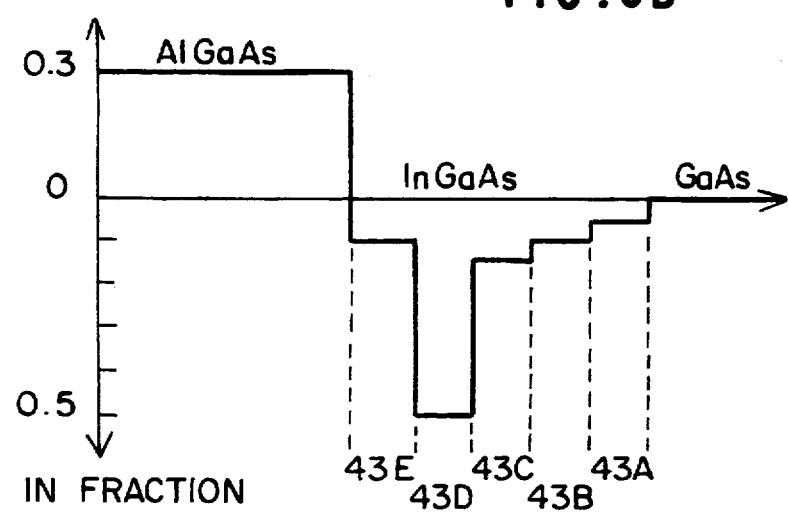
FIG. 5B is diagrams of the fraction of indium in ternary compound InGaAs of a quantum well planar channel layer and the fraction of aluminium in ternary compound AlGaAs of a potential barrier layer of a fourth embodiment according to the present invention.

FIG. 5B illustrates distributions of both the Al (aluminium) fraction Y of the n-type ternary compound AlGaAs potential barrier layer 44 and the In (indium) fraction of the undoped ternary compound InGaAs planar channel layers 43A, 438, 43C, 43D and 43E in a perpendicular direction to the heterojunction interface.

The distribution of the electron density takes a maximum value at a portion having a distance in the range from 50 to 100 angstroms from the heterojunction interface between the n-type ternary compound AlGaAs potential barrier layer 44 and the undoped ternary compound InGaAs planar channel layers 43A, 43B, 43C, 43D and 43E. The electron density of the two-dimensional electron gas takes large values in or in the vicinity of the planar channel layer 43D.

The conduction band edge of the n-type ternary compound AlGaAs potential barrier layer 44 lies above the step-graded conduction band edges of the undoped ternary compound InGaAs planar channel layers 43A, 43B, 43C, 43D and 43E. The conduction band edge of the n-type ternary compound AlGaAs potential barrier layer 44 has a peak at the heterojunction interface to the schottky gate 7 due to the schottky barrier contact.

Further, the conduction band edge of the undoped binary compound GaAs buffer layer 2 lies above the conduction band edge of the undoped ternary compound InGaAs planar channel layers 43A, 43B, 43C, 43D and 43E. The conduction band edge of the undoped binary compound GaAs buffer layer 2 has the uniformity in the level.

Thus, the electrons are confined in the undoped ternary compound InGaAs planar channel layers 43A, 43B, 43C, 43D and 43E. Therefore, the undoped ternary compound InGaAs planar channel layers 43A, 43B, 43C, 43D and 43E serve as the one-dimensional step-graded potential well, or the step-graded quantum well, and thus accomplish the one-dimensional electron confinement in cooperation with the both potential barriers of the n-type ternary compound AlGaAs potential barrier layer 44 and the undoped binary compound GaAs buffer layer 2.

With respect to the step-graded potential well, the conduction band edge of the planar channel layer 43B lies below the conduction band edges of the planar channel layer 43A. The conduction band edge of the planar channel layer 43C lies below the conduction band edges of the planar channel layers 43B. The conduction band edge of the planar channel layer 43D lies below the conduction band edges of the planar channel layers 43C. The conduction band edge of the planar channel layer 43E lies above the conduction band edges of the planar channel layers 43D. Thus, the potential band is most deep in the planar channel layer 43D. Electrons of the two-dimensional electron gas in the planar channel layer 43D are most strongly confined in the quantum well. Further, electrons confined most strongly in the planar channel layer 43D possess most great mobility due to the highest In content. The distribution of the electron density has a peak in or in the vicinity of the planar channel layer 43D. Thus, the major electrons in the confined two-dimensional electron gas exist in the planar channel layers 43B, 43C and 43D. Therefore, the major electrons in the planar channel layers 43B, 43C and 43D possess great mobility, in addition are strongly confined, thereby providing a high sheet electron density. As compared to the prior art, the effective electron mobility and the effective sheet electron density are great considerably.

The fraction X of In (indium) in ternary compound InGaAs takes low values in the planar channel layers 43A and 43E, although the fraction X of In (indium) takes high values in the planar channel layer 43D. This suppresses the average of the fraction X in the planar channel layers 43A, 43B, 43C, 43D and 43E to be higher, thereby realizing the smaller total thickness of the planar channel layers 43A, 43B, 43C, 43D and 43E than the critical thickness of the misfit dislocations. Therefore, the undoped ternary compound InGaAs planner channel layers 43A, 43B, 43C, 43D and 43E are free from the misfit dislocations caused by the lattice mismatch.

Eventually, the step-graded potential band structure of the planar channel layers 43A, 43B, 43C, 43D and 43E realizes a high sheet electron density and excellent electron transport property such as a high electron mobility without misfit dislocation caused by the lattice mismatch.

A fifth embodiment of the present invention will be described with reference to FIGS. 6A and 6B.

The structure of the two-dimensional electron gas field effect transistor of the fifth embodiment of the present invention is analogous to that of the above first embodiment, except for the planar channel layer serving as the quantum well in which the two-dimensional electron gas is confined. Thus, the structure will subsequently be described, but only the planar channel layer and the potential barrier layer.

Figure 6A:
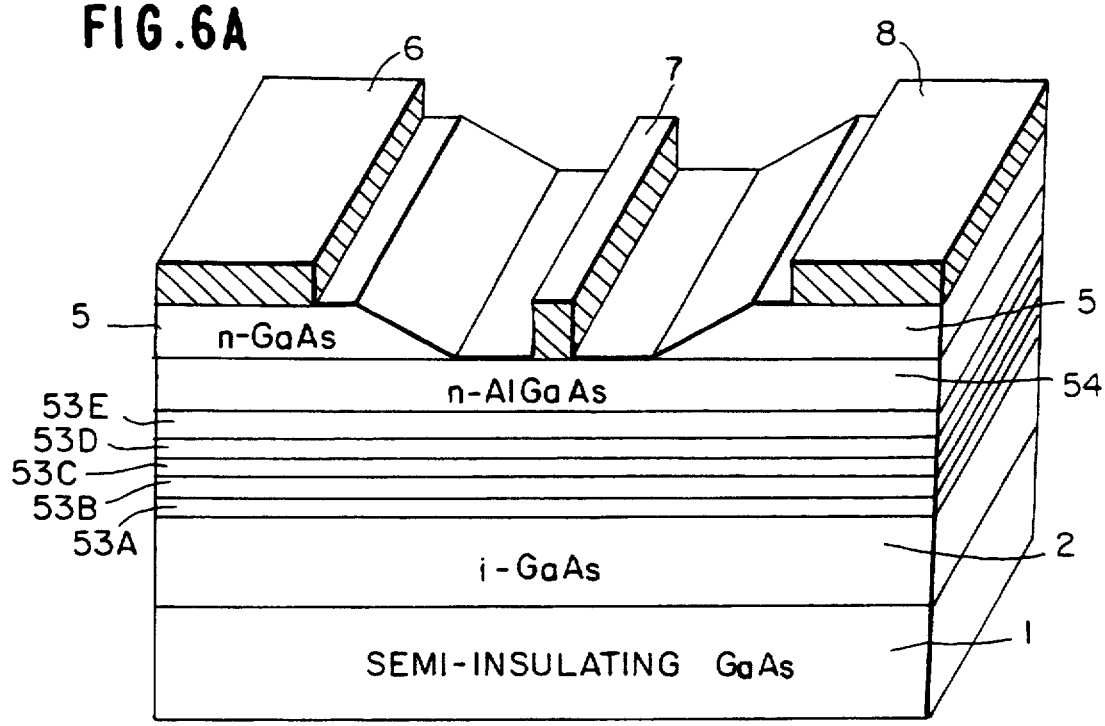
FIG. 6A is a fragmentary cross sectional elevation view illustrative of a novel structure of a two-dimensional electron gas field effect transistor of a fifth embodiment according to the present invention.

With reference to FIG. 6A, a planar channel layer comprises five layers 53A, 53B, 53C, 53D and 53E. The five planar channel layers 53A, 53B, 53C, 53D and 53E are made of undoped indium gallium arsenide ($In_XGa_{1-X}As$) of the intrinsic ternary compound semiconductors, but the fractions $X_1$, $X_2$, $X_3$, $X_4$ and $X_5$ of In (indium) are different each other. For example, the fraction $X_1$ of In (indium) in the planar channel layer 53A is 0.06. The fraction $X_2$ of In (indium) in the planar channel layer 53B is 0.14. The fraction $X_3$ of In (indium) in the planar channel layer 53C is 0.5. The fraction $X_4$ of In (indium) in the planar channel layer 53D is 0.14. The fraction $X_5$ of In (indium) in the planar channel layer 53E is 0.06. Each of the planar channel layers 53A, 53B, 53C, 53D and 53E has a thickness of approximately 30 angstroms Thus, the average of the In (indium) fractions of $X_1$, $X_2$, $X_3$, $X_4$ and $x_5$ is 0.18. The total thickness of the five planar channel layers 53A, 53B, 53C, 53D and 53E is 150 angstroms Under the above In (indium) fractions, the critical thickness of the misfit dislocation is approximately 170 angstroms Thus, the total thickness of the five planar channel layers 53A, 53B, 53C, 53D and 53E is smaller than the critical thickness of the misfit dislocation. Therefore, the undoped ternary compound InGaAs planner channel layers 53A, 53B, 53C, 53D and 53E are free from disadvantages caused by the misfit dislocations.

A potential barrier layer 54 having a thickness of approximately 250 angstroms is formed on the undoped ternary compound InGaAs planar channel layers 53A, 53B, 53C, 53D and 53E. The potential barrier layer 54 is made of aluminium gallium arsenide ($Al_YGa_{1-Y}As$) of the ternary compound semiconductors in which the fraction Y of Al (aluminium) is 0.3, the fraction of Ga (gallium) is 0.7. The ternary compound AlGaAs semiconductors of the potential barrier layer 54 are doped with the n-type dopant at a doping concentration of approximately $3 \times 10^{18}/cm^3$.

Figure 6B:
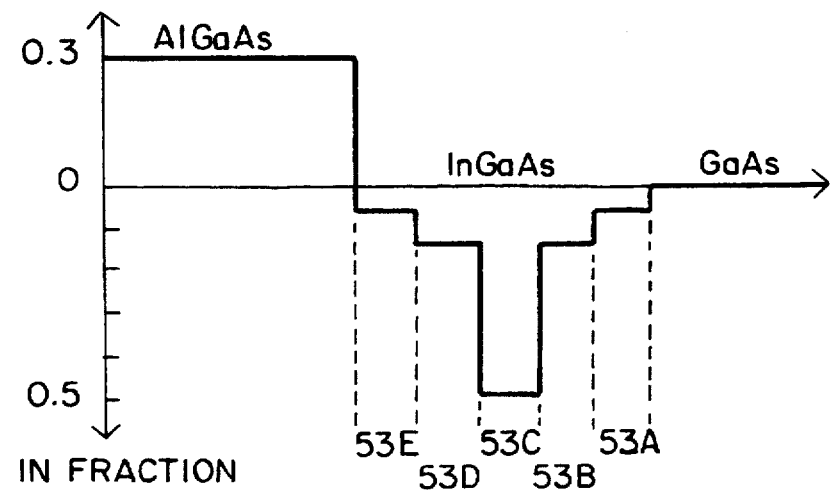
FIG. 6B is diagrams of the fraction of indium in ternary compound InGaAs of a quantum well planar channel layer and the fraction of aluminium in ternary compound AlGaAs of a potential barrier layer of a fifth embodiment according to the present invention.

FIG. 6B illustrates distributions of both the Al (aluminium) fraction Y of the n-type ternary compound AlGaAs potential barrier layer 54 and the In (indium) fraction of the undoped ternary compound InGaAs planar channel layers 53A, 53B, 53C, 53D and 53E in a perpendicular direction to the heterojunction interface.

The distribution of the electron density takes a maximum value at a portion having a distance in the range from 50 to 100 angstroms from the heterojunction interface between the n-type ternary compound AlGaAs potential barrier layer 54 and the undoped ternary compound InGaAs planar channel layers 53A, 53B, 53C, 53D and 53E. The electron density of the two-dimensional electron gas takes large values in or in the vicinity of the planar channel layer 53C.

The conduction band edge of the n-type ternary compound AlGaAs potential barrier layer 54 lies above the step-graded conduction band edges of the undoped ternary compound inGaAs planar channel layers 53A, 53B, 53C, 53D and 53E. The conduction band edge of the n-type ternary compound AlGaAs potential barrier layer 54 has a peak at the heterojunction interface to the schottky gate 7 due to the schottky barrier contact.

Further, the conduction band edge of the undoped binary compound GaAs buffer layer 2 lies above the conduction band edge of the undoped ternary compound InGaAs planar channel layers 53A, 53B, 53C, 53D and 53E. The conduction band edge of the undoped binary compound GaAs buffer layer 2 has the uniformity in the level.

Thus, the electrons are confined in the undoped ternary compound InGaAs planar channel layers 53A, 53B, 53C, 53D and 53E. Therefore, the undoped ternary compound InGaAs planar channel layers 53A, 53B, 53C, 53D and 53E serve as the one-dimensional step-graded potential well, or the step-graded quantum well, and thus accomplish the one-dimensional electron confinement in cooperation with the both potential barriers of the n-type ternary compound AlGaAs potential barrier layer 54 and the undoped binary compound GaAs buffer layer 2.

With respect to the step-graded potential well, the conduction band edge of the planar channel layer 53B lies below the conduction band edges of the planar channel layer 53A. The conduction band edge of the planar channel layer 53C lies below the conduction band edges of the planar channel layers 53B. The conduction band edge of the planar channel layer 53D lies above the conduction band edges of the planar channel layers 53C. The conduction band edge of the planar channel layer 53E lies above the conduction band edges of the planar channel layers 53D. Thus, the potential band is most deep in the planar channel layer 53C. Electrons of the two-dimensional electron gas in the planar channel layer 53C are most strongly confined in the quantum well. Further, electrons confined most strongly in the planar channel layer 53C possess most great mobility due to the highest In content. The distribution of the electron density has a peak in or in the vicinity of the planar channel layer 53C. Thus, the major electrons in the confined two-dimensional electron gas exist in the planar channel layers 53B, 53C and 53D. Therefore, the major electrons in the planar channel layers 53B, 53C and 53D possess great mobility, in addition are strongly confined, thereby providing a high sheet electron density. As compared to the prior art, the effective electron mobility and the effective sheet electron density are great considerably.

The fraction X of In (indium) in ternary compound InGaAs takes low values in the planar channel layers 53A and 53E, although the fraction X of In (indium) takes high values in the planar channel layer 53C. This suppresses the average of the fraction X in the planar channel layers 53A, 53B, 53C, 53D and 53E to be higher, thereby realizing the smaller total thickness of the planar channel layers 53A, 53B, 53C, 53D and 53E than the critical thickness of the misfit dislocations. Therefore, the undoped ternary compound InGaAs planner channel layers 53A, 53B, 53C, 53D and 53E are free from the misfit dislocations caused by the lattice mismatch.

Eventually, the step-graded potential band structure of the planar channel layers 53A, 53B, 53C, 53D and 53E realizes a high sheet electron density and excellent electron transport property such as a high electron mobility without misfit dislocation caused by the lattice mismatch.

A sixth embodiment of the present invention will be described with reference to FIGS. 7A and 7B.

The structure of the two-dimensional electron gas field effect transistor of the sixth embodiment of the present invention is analogous to that of the above first embodiment, except for the planar channel layer serving as the quantum well in which the two-dimensional electron gas is confined. Thus, the structure will subsequently be described, but only the planar channel layer and the potential barrier layer.

Figure 7A:
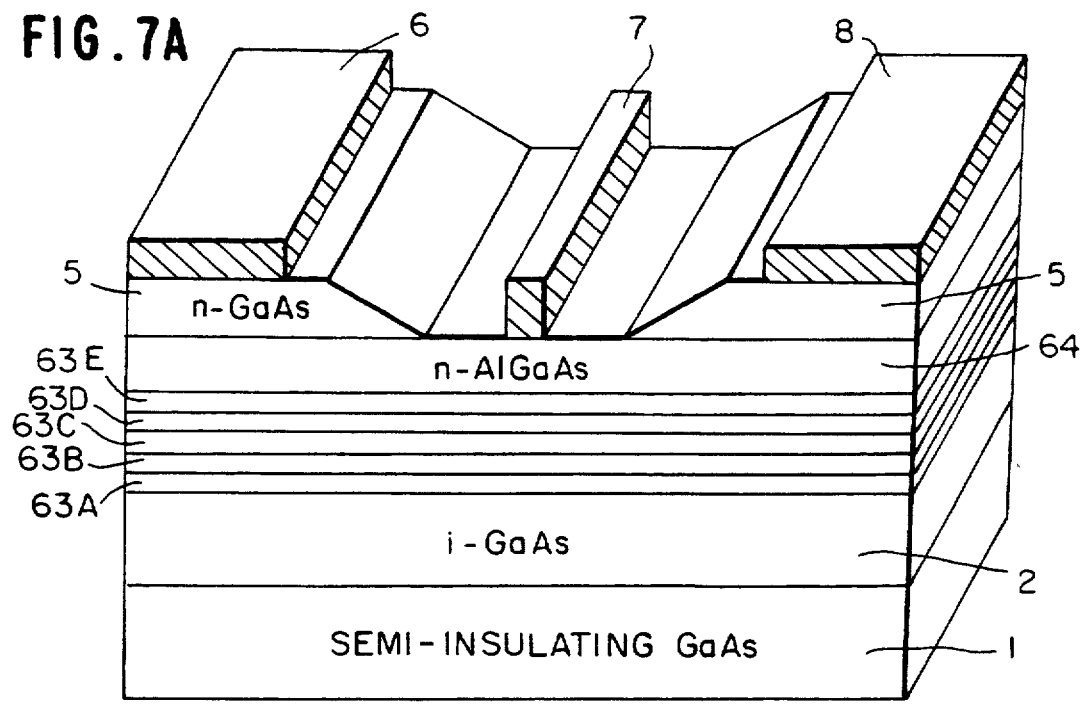
FIG. 7A is a fragmentary cross sectional elevation view illustrative of a novel structure of a two-dimensional electron gas field effect transistor of a sixth embodiment according to the present invention.

With reference to FIG. 7A, a planar channel layer comprises five layers 63A, 63B, 63C, 63D and 63E. The five planar channel layers 63A, 63B, 63C, 63D and 63E are made of undoped indium gallium arsenide ($In_XGa_{1-X}As$) of the intrinsic ternary compound semiconductors, but the fractions $X_1$, $X_2$, $X_3$, $X_4$ and $X_5$ of In (indium) are different each other. For example, the fraction $X_1$ of In (indium) in the planar channel layer 63A is 0.1. The fraction $X_2$ of In (indium) in the planar channel layer 63B is 0.3. The fraction $X_3$ of In (indium) in the planar channel layer 63C is 0.22. The fraction $X_4$ of In (indium) in the planar channel layer 63D is 0.16. The fraction $X_5$ of In (indium) in the planar channel layer 63E is 0.1. The planar channel layers 63A has a thickness of approximately 50 angstroms Each of the other planar channel layers 63B, 63C, 63D and 63E has a thickness of approximately 25 angstroms Thus, the average of the In (indium) fractions of $X_1$, $X_2$, $X_3$, $K_4$ and $X_5$ is 0.16. The total thickness of the five planar channel layers 63A, 63B, 63C, 63D and 63E is 150 angstroms. Under the above In (indium) fractions, the critical thickness of the misfit dislocation is approximately 200 angstroms. Thus, the total thickness of the five planar channel layers 63A, 63B, 63C, 63D and 63E is smaller than the critical thickness of the misfit dislocation. Therefore, the undoped ternary compound InGaAs planner channel layers 63A, 63B, 63C, 63D and 63E are free from disadvantages caused by the misfit dislocations.

A potential barrier layer 64 having a thickness of approximately 250 angstroms is formed on the undoped ternary compound InGaAs planar channel layers 63A, 63B, 63C, 63D and 63E. The potential barrier layer 64 is made of aluminium gallium arsenide ($Al_YGa_{1-Y}As$) of the ternary compound semiconductors in which the fraction Y of Al (aluminium) is 0.3, the fraction of Ga (gallium) is 0.7. The ternary compound AlGaAs semiconductors of the potential barrier layer 64 are doped with the n-type dopant at a doping concentration of approximately $3 \times 10^{18}/cm^3$.

Figure 7B:
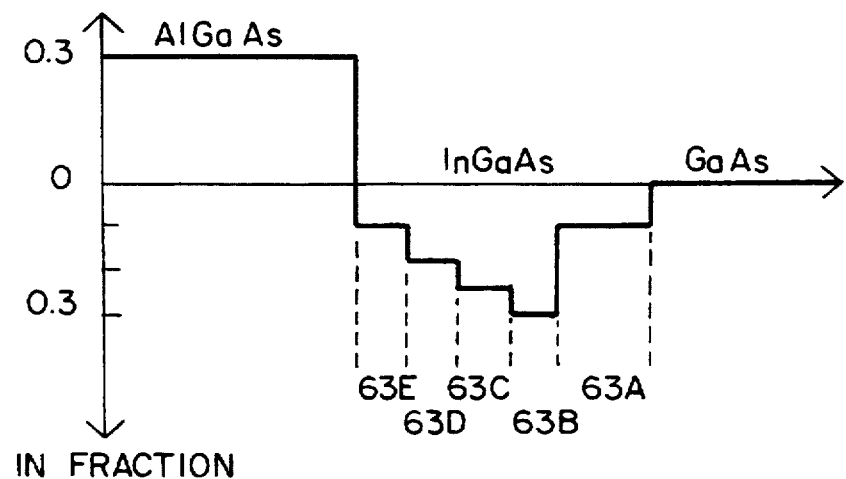
FIG. 7B is diagrams of the fraction of indium in ternary compound InGaAs of a quantum well planar channel layer and the fraction of aluminium in ternary compound AlGaAs of a potential barrier layer of a sixth embodiment according to the present invention.

FIG. 7B illustrates distributions of both the Al (aluminium) fraction Y of the n-type ternary compound AlGaAs potential barrier layer 64 and the In (indium) fraction of the undoped ternary compound InGaAs planar channel layers 63A, 63B, 63C, 63D and 63E in a perpendicular direction to the heterojunction interface.

The distribution of the electron density takes a maximum value at a portion having a distance in the range from 50 to 100 angstroms from the heterojunction interface between the n-type ternary compound AlGaAs potential barrier layer 64 and the undoped ternary compound InGaAs planar channel layers 63A, 63B, 63C, 63D and 63E. The electron density of the two-dimensional electron gas takes large values in or in the vicinity of the planar channel layer 63B.

The conduction band edge of the n-type ternary compound AlGaAs potential barrier layer 64 lies above the step-graded conduction band edges of the undoped ternary compound InGaAs planar channel layers 63A, 63B, 63C, 63D and 63E. The conduction band edge of the n-type ternary compound AlGaAs potential barrier layer 64 has a peak at the heterojunction interface to the schottky gate 7 due to the schottky barrier contact.

Further, the conduction band edge of the undoped binary compound GaAs buffer layer 2 lies above the conduction band edge of the undoped ternary compound InGaAs planar channel layers 63A, 63B, 63C, 63D and 63E. The conduction band edge of the undoped binary compound GaAs buffer layer 2 has the uniformity in the level.

Thus, the electrons are confined in the undoped ternary compound InGaAs planar channel layers 63A, 63B, 63C, 63D and 63E. Therefore, the undoped ternary compound InGaAs planar channel layers 63A, 63B, 63C, 63D and 63E serve as the one-dimensional step-graded potential well, or the step-graded quantum well, and thus accomplish the one-dimensional electron confinement in cooperation with the both potential barriers of the n-type ternary compound AlGaAs potential barrier layer 64 and the undoped binary compound GaAs buffer layer 2.

With respect to the step-graded potential well, the conduction band edge of the planar channel layer 63B lies below the conduction band edges of the planar channel layer 63A. The conduction band edge of the planar channel layer 63C lies above the conduction band edges of the planar channel layers 63B. The conduction band edge of the planar channel layer 63D lies above the conduction band edges of the planar channel layers 63C. The conduction band edge of the planar channel layer 63E lies above the conduction band edges of the planar channel layers 63D. Thus, the potential band is most deep in the planar channel layer 63B. Electrons of the two-dimensional electron gas in the planar channel layer 63B are most strongly confined in the quantum well. Further, electrons confined most strongly in the planar channel layer 63B possess most great mobility due to the highest In content. The distribution of the electron density has a peak in or in the vicinity of the planar channel layer 63B. Thus, the major electrons in the confined two-dimensional electron gas exist in the planar channel layers 63B, 63C and 63D. Therefore, the major electrons in the planar channel layers 63B, 63C and 63D possess great mobility. in addition are strongly confined, thereby providing a high sheet electron density. As compared to the prior art, the effective electron mobility and the effective sheet electron density are great considerably.

The fraction X of In (indium) in ternary compound InGaAs takes low values in the planar channel layers 63A and 63E, although the fraction X of In (indium) takes high values in the planar channel layer 63B. This suppresses the average of the fraction X in the planar channel layers 63A, 63B, 63C, 63D and 63E to be higher, thereby realizing the smaller total thickness of the planar channel layers 63A, 63B, 63C, 63D and 63E than the critical thickness of the misfit dislocations. Therefore, the undoped ternary compound InGaAs planner channel layers 63A, 638, 63C, 63D and 63E are free from the misfit dislocations caused by the lattice mismatch.

Eventually, the step-graded potential band structure of the planar channel layers 63A, 63B, 63C, 63D and 63E realizes a high sheet electron density and excellent electron transport property such as a high electron mobility without misfit dislocation caused by the lattice mismatch.

Although in the above embodiments the variation of the fraction of In (indium) in the ternary compound InGaAs of the planar channel layer has the step-graded profile, a sloped or curved profile of the variation of the In (indium) fraction is also available.

The compound semiconductor materials of the epitaxial multilayers, for example, the buffer layer, the planar channel layer, the potential barrier layer and the cap layers are replaceable with other compound semiconductors to match various requirements. For example, a combination of the binary compound InP semi-insulating bulk with InAiAs/InGaAs compound system or with InP/InGaAs compound system is also applicable to such two-dimensional electron gas field effect transistors.

While in the above embodiments the compound semiconductor multilayer structure having the two-dimensional electron gas is utilized for such field effect transistors, such multilayer structure is applicable to other semiconductor devices, especially requiring high speed and high frequency performances due to the excellent electron transport property such as the great electron mobility and the high sheet electron density of the two-dimensional electron gas provided by the novel multilayer structure.

Whereas modifications of the present invention will no doubt be apparent to a person of ordinary skilled in the art, it is to be understood that the embodiments shown and described by way of illustration are by no means intended to be considered in a limiting sense. Accordingly, it is to be intended by the claims to cover all modifications of the invention which fall within the sprit and scope of the invention.

What is claimed is:

1. A compound semiconductor multilayer structure having a two-dimensional electron gas comprising:
    a first potential barrier being made of a first energy band gap semiconductor material;
    a second potential barrier being made of a second energy band gap semiconductor material;
    a quantum well layer having opposite interfaces abutting said first and second potential barriers, said quantum well layer being made of a third energy band gap compound semiconductor material, said third energy band gap being smaller than said first and second energy band gaps, said third energy band gap having a variation in a perpendicular direction to said interfaces and having a minimum value in an area between, but not adjacent to said interfaces;
    said third compound semiconductor material comprises ternary compound $In_XGa_{1-X}As$, the fraction X of In having a variation in a perpendicular direction to said interfaces and having a maximum value in an area between, but not adjacent to said interfaces;
    said ternary compound $In_XGa_{1-X}As$ is an intrinsic compound semiconductor material;
    said first energy band gap semiconductor material comprises ternary compound AlGaAs doped with an n-type dopant;
    said second energy band gap semiconductor material comprises intrinsic binary compound GaAs;
    said ternary compound $In_XGa_{1-X}As$ of said quantum well layer has the fraction X of In taking a maximum value at a distance from said interface to said first potential barrier, said distance being in the range from 30 angstroms to 110 angstroms; and
    said ternary compound $In_XGa_{1-X}As$ quantum well layer comprises:
        a first layer, abutting said AlGaAs first potential barrier, having a first fraction $X_1$ of In;
        a second layer, abutting said first layer, having a second fraction $X_2$ of In being larger than said first fraction $X_1$;
        a third layer, abutting said second layer, having a third fraction $X_3$ of In being smaller than said second fraction $X_2$; and
        a fourth layer, abutting said third layer, having a fourth fraction $X_4$ of In being smaller than said third fraction $X_3$.

2. The structure as claimed in claim 1, wherein:
    said doped ternary compound $Al_YGa_{1-Y}As$ of said first potential barrier has a fraction Y of Al of 0.3;
    said first fraction of In is 0.1;

said second fraction of In is 0.3;
said third fraction of In is 0.2;
said fourth fraction of In is 0.1; and
each of said first, second, third and fourth layers has a thickness of 40 angstroms.

3. A compound semiconductor multilayer structure having a two-dimensional electron gas comprising:
a first potential barrier being made of a first energy band gap semiconductor material;
a second potential barrier being made of a second energy band gap semiconductor material;
a quantum well layer having opposite interfaces abutting said first and second potential barriers, said quantum well layer being made of a third energy band gap compound semiconductor material, said third energy band gap being smaller than said first and second energy band gaps, said third energy band gap having a variation in a perpendicular direction to said interfaces and having a minimum value in an area between, but not adjacent to said interfaces;
said third compound semiconductor material comprises ternary compound $In_XGa_{1-X}As$, the fraction X of In having a variation in a perpendicular direction to said interfaces and having a maximum value in an area between, but not adjacent to said interfaces;
said ternary compound $In_XGa_{1-X}As$ is an intrinsic compound semiconductor material;
said first energy band gap semiconductor material comprises ternary compound AlGaAs doped with an n-type dopant;
said second energy band gap semiconductor material comprises intrinsic binary compound GaAs;
said ternary compound $In_XGa_{1-X}As$ of said quantum well layer has the fraction X of In taking a maximum value at a distance from said interface to said first potential barrier, said distance being in the range from 30 angstroms to 110 angstroms; and
said ternary compound $In_XGa_{1-X}As$ quantum well layer comprises:
a first layer, abutting said AlGaAs first potential barrier having a first fraction $X_1$ of In;
a second layer, abutting said first layer, having a second fraction $X_2$ of In being larger than said first fraction $X_1$;
a third layer, abutting said second layer, having a third fraction $X_3$ of In being larger than said second fraction $X_2$; and
a fourth layer, abutting said third layer, having a fourth fraction $X_4$ of In being smaller than said third fraction $X_3$.

4. The structure as claimed in claim 3, wherein:
said doped ternary compound $Al_YGa_{1-Y}As$ of said first potential barrier has a fraction Y of Al of 0.3;
said first fraction of In is 0.1;
said second fraction of In is 0.2;
said third fraction of In is 0.3;
said fourth fraction of In is 0.1; and
each of said first, second, third and fourth layers has a thickness of 40 angstroms.

5. A compound semiconductor multilayer structure having a two-dimensional electron gas comprising:
a first potential barrier being made of a first energy band gap semiconductor material;
a second potential barrier being made of a second energy band gap semiconductor material;
a quantum well layer having opposite interfaces abutting said first and second potential barriers, said quantum well layer being made of a third energy band gap compound semiconductor material, said third energy band gap being smaller than said first and second energy band gaps, said third energy band gap having a variation in a perpendicular direction to said interfaces and having a minimum value in an area between, but not adjacent to said interfaces;
said third compound semiconductor material comprises ternary compound $In_XGa_{1-X}As$, the fraction X of In having a variation in a perpendicular direction to said interfaces and having a maximum value in an area between, but not adjacent to said interfaces;
said ternary compound $In_XGa_{1-X}As$ is an intrinsic compound semiconductor material;
said first energy band gap semiconductor material comprises ternary compound AlGaAs doped with an n-type dopant;
said second energy band gap semiconductor material comprises intrinsic binary compound GaAs;
said ternary compound $In_XGa_{1-X}As$ of said quantum well layer has the fraction X of In taking a maximum value at a distance from said interface to said first potential barrier, said distance being in the range from 30 angstroms to 110 angstroms; and
said ternary compound $In_XGa_{1-X}As$ quantum well layer comprises:
a first layer, abutting said AlGaAs first potential barrier, having a first fraction $X_1$ of In;
a second layer, abutting said first layer, having a second fraction $X_2$ of In being larger than said first fraction $X_1$;
a third layer, abutting said second layer, having a third fraction $X_3$ of In being smaller than said second fraction $X_2$;
a fourth layer, abutting said third layer, having a fourth fraction $X_4$ of In being smaller than said third fraction $X_3$; and
a fifth layer, abutting said fourth layer, having a fifth fraction $X_5$ of In being smaller than fourth fraction $X_4$.

6. The structure as claimed in claim 5, wherein:
said doped ternary compound $Al_YGa_{1-Y}As$ of said first potential barrier has a fraction Y of Al of 0.3;
said first fraction of In is 0.1;
said second fraction of In is 0.3;
said third fraction of In is 0.22;
said fourth fraction of In is 0.16;
said fifth fraction of In is 0.1;
each of said first, second, third, fourth and fifth layers has a thickness of 25 angstroms.

7. A compound semiconductor multilayer structure having a two-dimensional electron gas comprising:
a first potential barrier being made of a first energy band gap semiconductor material;
a second potential barrier being made of a second energy band gap semiconductor material;
a quantum well layer having opposite interfaces abutting said first and second potential barriers, said quantum well layer being made of a third energy band gap compound semiconductor material, said third energy band gap being smaller than said first and second energy band gaps, said third energy band gap having a variation in a perpendicular direction to said interfaces and having a minimum value in an area between, but not adjacent to said interfaces;

said third compound semiconductor material comprises ternary compound $In_XGa_{1-X}As$, the fraction X of In having a variation in a perpendicular direction to said interfaces and having a maximum value in an area between, but not adjacent to said interfaces;

said ternary compound $In_XGa_{1-X}As$ is an intrinsic compound semiconductor material;

said first energy band gap semiconductor material comprises ternary compound AlGaAs doped with an n-type dopant;

said second energy band gap semiconductor material comprises intrinsic binary compound GaAs;

said ternary compound $In_XGa_{1-X}As$ of said quantum well layer has the fraction X of In taking a maximum value at a distance from said interface to said first potential barrier, said distance being in the range from 30 angstroms to 110 angstroms;

said ternary compound $In_XGa_{1-X}As$ quantum well layer comprises:
- a first layer, abutting said AlGaAs first potential barrier, having a first fraction $X_1$ of In;
- a second layer, abutting said first layer, having a second fraction $X_2$ of In being larger than said first fraction $X_1$;
- a third layer, abutting said second layer, having a third fraction $X_3$ of In being larger than said second fraction $X_2$;
- a fourth layer, abutting said third layer, having a fourth fraction $X_4$ of In being smaller than said third fraction $X_3$; and
- a fifth layer, abutting said fourth layer, having a fifth fraction $X_5$ of In being smaller than said fourth fraction $X_4$.

8. The structure as claimed in claim 7, wherein:
said doped ternary compound $Al_YGa_{1-Y}As$ of said first potential barrier has a fraction Y of Al of 0.3;
said first fraction of In is 0.06;
said second fraction of In is 0.14;
said third fraction of In is 0.5;
said fourth fraction of In is 0.14;
said fifth fraction of In is 0.06;
each of said first, second, third, fourth and fifth layers has a thickness of 30 angstroms.

9. A compound semiconductor multilayer structure having a two-dimensional electron gas comprising:
a first potential barrier being made of a first energy band gap semiconductor material;
a second potential barrier being made of a second energy band gap semiconductor material;
a quantum well layer having opposite interfaces abutting said first and second potential barriers, said quantum well layer being made of a third energy band gap compound semiconductor material, said third energy band gap being smaller than said first and second energy band gaps, said third energy band gap having a variation in a perpendicular direction to said interfaces and having a minimum value in an area between, but not adjacent to said interfaces;

said third compound semiconductor material comprises ternary compound $In_XGa_{1-X}As$, the fraction X of In having a variation in a perpendicular direction to said interfaces and having a maximum value in an area between, but not adjacent to said interfaces;

said ternary compound $In_XGa_{1-X}As$ is an intrinsic compound semiconductor material;

said first energy band gap semiconductor material comprises ternary compound AlGaAs doped with an n-type dopant;

said second energy band gap semiconductor material comprises intrinsic binary compound GaAs;

said ternary compound $In_XGa_{1-X}As$ of said quantum well layer has the fraction X of In taking a maximum value at a distance from said interface to said first potential barrier, said distance being in the range from 30 angstroms to 100 angstroms;

said ternary compound $In_XGa_{1-X}As$ quantum well layer comprises:
- a first layer, abutting said AlGaAs first potential barrier, having a first fraction $X_1$ of In;
- a second layer, abutting said first layer, having a second fraction $X_2$ of In being larger than said first fraction $X_1$;
- a third layer, abutting said second layer, having a third fraction $X_3$ of In being larger than said second fraction $X_2$;
- a fourth layer, abutting said third layer, having a fourth fraction $X_4$ of In being larger than said third fraction $X_3$; and
- a fifth layer, abutting said fourth layer, having a fifth fraction $X_5$ of In being smaller than said fourth fraction $X_4$.

10. The structure as claimed in claim 9, wherein:
said doped ternary compound $Al_YGa_{1-Y}As$ of said first potential barrier has a fraction Y of Al of 0.3;
said first fraction of In is 0.06;
said second fraction of In is 0.1;
said third fraction of In is 0.14;
said fourth fraction of In is 0.5;
said fifth fraction of In is 0.1;
each of said first, second, third, fourth and fifth layers has a thickness of 30 angstroms.

11. A field effect transistor having a two-dimensional electron gas comprising:
a semi-insulating substrate;
an epitaxial multilayer structure formed on said substrate, said structure comprising:
a potential barrier layer made of a first energy band gap semiconductor material;
a buffer layer abutting said substrate, said buffer layer being made of a second energy band gap semiconductor material;
a quantum well planar channel layer having opposite interfaces abutting said potential barrier layer and buffer layer, said channel layer being made of a third energy band gap compound semiconductor material, said third energy band gap being smaller than said first and second energy band gaps, said third energy band gap having a variation in a perpendicular direction to said interfaces and having a minimum value in an area between, but not adjacent to said interfaces;
source and drain regions formed on said potential barrier layer;
a gate contact formed on said potential barrier layer;
said third compound semiconductor material comprises ternary compound $In_XGa_{1-X}As$, the fraction X of In having a variation in a perpendicular direction to said interfaces and having a maximum value in an area between, but not adjacent to said interfaces;

said ternary compound $In_XGa_{1-X}As$ is an intrinsic compound semiconductor material;

said first energy band gap semiconductor material comprises ternary compound AlGaAs doped with an n-type dopant;

said second energy band gap semiconductor material comprises intrinsic binary compound GaAs;

said ternary compound $In_XGa_{1-X}As$ of said channel layer has the fraction X of In taking a maximum value at a distance from said interface to said potential barrier layer, said distance being in the range from 30 angstroms to 100 angstroms; and said ternary compound $In_XGa_{1-X}As$ channel layer comprises:

- a first layer, abutting said AlGaAs potential barrier layer, having a first fraction $X_1$ of In;
- a second layer, abutting said first layer, having a second fraction $X_2$ of In being larger than said first fraction $X_1$;
- a third layer, abutting said second layer, having a third fraction $X_3$ of In being smaller than said second fraction $X_2$; and
- a fourth layer, abutting said third layer, having a fourth fraction $X_4$ of In being smaller than said third fraction $X_3$.

12. The transistor as claimed in claim 11, wherein:

said doped ternary compound $Al_YGa_{1-Y}As$ of said first potential barrier has a fraction Y of Al of 0.3;

said first fraction of In is 0.1;

said second fraction of In is 0.3;

said third fraction of In is 0.2;

said fourth fraction of In is 0.1; and each of said first, second, third and fourth layers has a thickness of 40 angstroms.

13. A field effect transistor having a two-dimensional electron gas comprising:

a semi-insulating substrate;

an epitaxial multilayer structure formed on said substrate, said structure comprising:

- a potential barrier layer made of a first energy band gap semiconductor material;
- a buffer layer abutting said substrate, said buffer layer being made of a second energy band gap semiconductor material;
- a quantum well planar channel layer having opposite interfaces abutting said potential barrier layer and buffer layer, said channel layer being made of a third energy band gap compound semiconductor material, said third energy band gap being smaller than said first and second energy band gaps, said third energy band gap having a variation in a perpendicular direction to said interfaces and having a minimum value in an area between, but not adjacent to said interfaces;

source and drain regions formed on said potential barrier layer;

a gate contact formed on said potential barrier layer;

said third compound semiconductor material comprises ternary compound $In_XGa_{1-X}As$, the fraction X of In having a variation in a perpendicular direction to said interfaces and having a maximum value in an area between, but not adjacent to said interfaces;

said ternary compound $In_XGa_{1-X}As$ is an intrinsic compound semiconductor material;

said first energy band gap semiconductor material comprises ternary compound AlGaAs doped with an n-type dopant;

said second energy band gap semiconductor material comprises intrinsic binary compound GaAs;

said ternary compound $In_XGa_{1-X}As$ of said channel layer has the fraction X of In taking a maximum value at a distance from said interface to said potential barrier layer, said distance being in the range from 30 angstroms to 100 angstroms; and said ternary compound $In_XGa_{1-X}As$ channel layer comprises:

- a first layer, abutting said AlGaAs potential barrier layer, having a first fraction $X_1$ of In;
- a second layer, abutting said first layer, having a second fraction $X_2$ of In being larger than said first fraction $X_1$;
- a third layer, abutting said second layer, having a third fraction $X_3$ of In being larger than said second fraction $X_2$; and
- a fourth layer, abutting said third layer, having a fourth fraction $X_4$ of In being smaller than said third fraction $X_3$.

14. The transistor as claimed in claim 13, wherein:

said doped ternary compound $Al_YGa_{1-Y}As$ of said first potential barrier has a fraction Y of Al of 0.3;

said first fraction of In is 0.1;

said second fraction of In is 0.2;

said third fraction of In is 0.3;

said fourth fraction of In is 0.1; and each of said first, second, third and fourth layers has a thickness of 40 angstroms.

15. A field effect transistor having a two-dimensional electron gas comprising:

a semi-insulating substrate;

an epitaxial multilayer structure formed on said substrate, said structure comprising:

- a potential barrier layer made of a first energy band gap semiconductor material;
- a buffer layer abutting said substrate, said buffer layer being made of a second energy band gap semiconductor material;
- a quantum well planar channel layer having opposite interfaces abutting said potential barrier layer and buffer layer, said channel layer being made of a third energy band gap compound semiconductor material, said third energy band gap being smaller than said first and second energy band gaps, said third energy band gap having a variation in a perpendicular direction to said interfaces and having a minimum value in an area between, but not adjacent to said interfaces;

source and drain regions formed on said potential barrier layer;

a gate contact formed on said potential barrier layer;

said third compound semiconductor material comprises ternary compound $In_XGa_{1-X}As$, the fraction X of In having a variation in a perpendicular direction to said interfaces and having a maximum value in an area between, but not adjacent to said interfaces;

said ternary compound $In_XGa_{1-X}As$ is an intrinsic compound semiconductor material;

said first energy band gap semiconductor material comprises ternary compound AlGaAs doped with an n-type dopant;

said second energy band gap semiconductor material comprises intrinsic binary compound GaAs;

said ternary compound $In_XGa_{1-X}As$ of said channel layer has the fraction X of In taking a maximum value at a distance from said interface to said potential barrier layer, said distance being in the range from 30 angstroms to 100 angstroms; and said ternary compound $In_XGa_{1-X}As$ channel layer comprises:
- a first layer, abutting said AlGaAs potential barrier layer, having a first fraction $X_1$ of In;
- a second layer, abutting said first layer, having a second fraction $X_2$ of In being larger than said first fraction $X_1$;
- a third layer, abutting said second layer, having a third fraction $X_3$ of In being smaller than said second fraction $X_2$;
- a fourth layer, abutting said third layer, having a fourth fraction $X_4$ of In being smaller than said third fraction $X_3$; and
- a fifth layer abutting said fourth layer, having a fifth fraction $X_5$ of In being smaller than said fourth fraction $X_4$.

16. The transistor as claimed in claim 15, wherein:
said doped ternary compound $Al_YGa_{1-Y}As$ of said first potential barrier has a fraction Y of Al of 0.3;
said first fraction of In is 0.1;
said second fraction of In is 0.3;
said third fraction of In is 0.22;
said fourth fraction of In is 0.16;
said fifth fraction of In is 0.1; and
each of said first, second, third, fourth and fifth layers has a thickness of 25 angstroms.

17. A field effect transistor having a two-dimensional electron gas comprising:
a semi-insulating substrate;
an epitaxial multilayer structure formed on said substrate, said structure comprising:
- a potential barrier layer made of a first energy band gap semiconductor material;
- a buffer layer abutting said substrate, said buffer layer being made of a second energy band gap semiconductor material;
- a quantum well planar channel layer having opposite interfaces abutting said potential barrier layer and buffer layer, said channel layer being made of a third energy band gap compound semiconductor material, said third energy band gap being smaller than said first and second energy band gaps, said third energy band gap having a variation in a perpendicular direction to said interfaces and having a minimum value in an area between, but not adjacent to said interfaces;

source and drain regions formed on said potential barrier layer;
a gate contact formed on said potential barrier layer;
said third compound semiconductor material comprises ternary compound $In_XGa_{1-X}As$, the fraction X of In having a variation in a perpendicular direction to said interfaces and having a maximum value in an area between, but not adjacent to said interfaces;
said ternary compound $In_XGa_{1-X}As$ is an intrinsic compound semiconductor material;
said first energy band gap semiconductor material comprises ternary compound AlGaAs doped with an n-type dopant;
said second energy band gap semiconductor material comprises intrinsic binary compound GaAs;
said ternary compound $In_XGa_{1-X}As$ of said channel layer has the fraction X of In taking a maximum value at a distance from said interface to said potential barrier layer, said distance being in the range from 30 angstroms to 100 angstroms; and said ternary compound $In_XGa_{1-X}As$ channel layer comprises:
- a first layer, abutting said AlGaAs potential barrier layer, having a first fraction $X_1$ of In;
- a second layer, abutting said first layer, having a second fraction $X_2$ of In being larger than said first fraction $X_1$;
- a third layer, abutting said second layer, having a third fraction $X_3$ of In being larger than said second fraction $X_2$;
- a fourth layer, abutting said third layer, having a fourth fraction $X_4$ of In being smaller than said third fraction $X_3$; and
- a fifth layer, abutting said fourth layer, having a fifth fraction $X_5$ of In being smaller than said fourth fraction $X_4$.

18. The transistor as claimed in claim 17, wherein:
said doped ternary compound $Al_YGa_{1-Y}As$ of said first potential barrier has a fraction Y of Al of 0.3;
said first fraction of In is 0.06;
said second fraction of In is 0.14;
said third fraction of In is 0.5;
said fourth fraction of In is 0.14;
said fifth fraction of In is 0.06; and
each of said first, second, third, fourth and fifth layers has a thickness of 30 angstroms.

19. A field effect transistor having a two-dimensional electron gas comprising:
a semi-insulating substrate;
an epitaxial multilayer structure formed on said substrate, said structure comprising:
- a potential barrier layer made of a first energy band gap semiconductor material;
- a buffer layer abutting said substrate, said buffer layer being made of a second energy band gap semiconductor material;
- a quantum well planar channel layer having opposite interfaces abutting said potential barrier layer and buffer layer, said channel layer being made of a third energy band gap compound semiconductor material, said third energy band gap being smaller than said first and second energy band gaps, said third energy band gap having a variation in a perpendicular direction to said interfaces and having a minimum value in an area between, but not adjacent to said interfaces;

source and drain regions formed on said potential barrier layer;
a gate contact formed on said potential barrier layer;
said third compound semiconductor material comprises ternary compound $In_XGa_{1-X}As$, the fraction X of In having a variation in a perpendicular direction to said interfaces and having a maximum value in an area between, but not adjacent to said interfaces;
said ternary compound $In_XGa_{1-X}As$ is an intrinsic compound semiconductor material;
said first energy band gap semiconductor material comprises ternary compound AlGaAs doped with an n-type dopant;
said second energy band gap semiconductor material comprises intrinsic binary compound GaAs;
said ternary compound $In_XGa_{1-X}As$ of said channel layer has the fraction X of In taking a maximum value at a distance from said interface to said potential barrier layer, said distance being in the range from 30 angstroms to 100 angstroms; and said ternary compound $In_xGa_{1-x}As$ channel layer comprises:

a first layer, abutting said AlGaAs potential barrier layer, having a first fraction $X_1$ of In;

a second layer, abutting said first layer, having a second fraction $X_2$ of In being larger than said first fraction $X_1$;

a third layer, abutting said second layer, having a third fraction $X_3$ of In being larger than said second fraction $X_2$;

a fourth layer, abutting said third layer, having a fourth fraction $X_4$ of In being larger than said third fraction $X_3$; and a fifth layer, abutting said fourth layer, having a fifth fraction $X_5$ of In being smaller than said fourth fraction $X_4$.

20. The transistor as claimed in claim 19, wherein:

said doped ternary compound $Al_yGa_{1-y}As$ of said first potential barrier has a fraction Y of Al of 0.3;

said first fraction of In is 0.06;

said second fraction of In is 0.1;

said third fraction of In is 0.14;

said fourth fraction of In is 0.5;

said fifth fraction 6f In is 0.1; and each of said first, second, third, fourth and fifth layers has a thickness of 30 angstroms.

* * * * *

UNITED STATES PATENT AND TRADEMARK OFFICE
CERTIFICATE OF CORRECTION

PATENT NO. : 5,373,168
DATED : December 13, 1994
INVENTOR(S) : Yuji Ando, et. al.

It is certified that error appears in the above-indentified patent and that said Letters Patent is hereby corrected as shown below:

Column 1, line 21, delete "tile" and insert --the--;

Column 1, line 54, delete "collusions" and insert --collisions--;

Column 2, line 4, delete "The" and insert --the--;

Column 3, line 15, delete "AIGaAs" and insert --AlGaAs--;

Column 3, line 56, delete "GaAe" and insert --GaAs--;

Column 4, line 29, delete the second occurrence of "to";

Column 4, line 62, delete "bad" and insert --band--;

Column 11, line 23, delete "$X_l1$" and insert --$X_l$--;

Column 11, line 32, delete "138" and insert --13B--;

UNITED STATES PATENT AND TRADEMARK OFFICE
CERTIFICATE OF CORRECTION

PATENT NO. : 5,373,168
DATED : December 13, 1994
INVENTOR(S) : Yuji ando, et. al.

It is certified that error appears in the above-indentified patent and that said Letters Patent is hereby corrected as shown below:

Column 12, line 6, delete "yhe" and insert --the--;

Column 12, line 19, delete "ethcing" and insert --etching--;

Column 13, line 25, delete "138" and insert --13B--;

Column 13, line 42, delete "planner" and insert --planar--;
Column 14, line 15, delete "planner" and insert --planar--;

Column 14, line 58, delete "bad" and insert --band--;

Column 15, line 23, delete "I" and insert --In--;

Column 15, line 29, delete "238" and insert --23B--;

Column 15, line 43, delete "planner" and insert --planar--;

UNITED STATES PATENT AND TRADEMARK OFFICE
CERTIFICATE OF CORRECTION

PATENT NO. : 5,373,168
DATED : December 13, 1994
INVENTOR(S) : Yuji Ando, et. al.

It is certified that error appears in the above-indentified patent and that said Letters Patent is hereby corrected as shown below:

Column 16, line 16, delete "planner" and insert --planar--;

Column 17, line 45, delete "planner" and insert --planar--;

Column 18, line 17, delete "438" and insert --43B--;

Column 18, line 20, delete "planner" and insert --planar--;

Column 18, line 38, delete "438" and insert --43B--;

Column 19, line 44, delete "planner" and insert --planar--;

Column 20, line 11, delete "$x_5$" and insert --$X_5$--;

UNITED STATES PATENT AND TRADEMARK OFFICE
CERTIFICATE OF CORRECTION

PATENT NO. : 5,373,168
DATED : December 13, 1994
INVENTOR(S) : Yuji Ando, et. al.

It is certified that error appears in the above-indentified patent and that said Letters Patent is hereby corrected as shown below:

Column 20, line 19, delete "planner" and insert --planar--;

Column 20, line 51, delete "inGaAs" and inert --InGaAs--;

Column 21, line 43, delete "planner" and insert --planar--;

Column 22, line 11, delete "$K_4$" and insert --$X_4$--;

Column 22, line 19, delete "planner" and insert --planar--;

Column 23, line 43, delete "638" and insert --63B--;

Column 23, line 63, delete "InAiAs" and insert --InAlAs--;

UNITED STATES PATENT AND TRADEMARK OFFICE
CERTIFICATE OF CORRECTION

PATENT NO. : 5,373,168
DATED : December 13, 1994
INVENTOR(S) : Yuji Ando, et. al.

It is certified that error appears in the above-indentified patent and that said Letters Patent is hereby corrected as shown below:

Column 33, line 2, delete "100" and insert --110--;

Column 34, line 14, delete "of" and insert --of--.

Signed and Sealed this

Twelfth Day of December, 1995

Attest:

BRUCE LEHMAN

Attesting Officer

Commissioner of Patents and Trademarks